United States Patent
Kim et al.

(10) Patent No.: US 12,213,357 B2
(45) Date of Patent: Jan. 28, 2025

(54) DISPLAY DEVICE

(71) Applicant: SAMSUNG DISPLAY CO., LTD., Yongin-si (KR)

(72) Inventors: Hyeonsik Kim, Yongin-si (KR); Gun Hee Kim, Seoul (KR); Sangwoo Kim, Seoul (KR); Taekyung Ahn, Yongin-si (KR); Dae-Young Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/813,993

(22) Filed: Jul. 21, 2022

(65) Prior Publication Data

US 2023/0116805 A1 Apr. 13, 2023

(30) Foreign Application Priority Data

Sep. 29, 2021 (KR) .................. 10-2021-0128445

(51) Int. Cl.
| | |
|---|---|
| *G06F 3/041* | (2006.01) |
| *G06F 3/044* | (2006.01) |
| *G06V 40/13* | (2022.01) |
| *G09G 3/3233* | (2016.01) |
| *G09G 3/3275* | (2016.01) |

(Continued)

(52) U.S. Cl.
CPC ....... *H10K 59/131* (2023.02); *G06V 40/1318* (2022.01); *G09G 3/3233* (2013.01); *G09G 2300/0426* (2013.01); *G09G 2300/0819* (2013.01); *G09G 2300/0842* (2013.01);

(Continued)

(58) Field of Classification Search
CPC ............ H01L 27/3276; H01L 27/3234; G06V 40/1318; G09G 3/3233; G09G 2300/0819–0861; G09G 2320/0238

See application file for complete search history.

(56) References Cited

U.S. PATENT DOCUMENTS

| | | |
|---|---|---|
| 11,087,679 B2 | 8/2021 | Lim et al. |
| 2013/0146866 A1* | 6/2013 | Kitagawa .......... H01L 27/14632 257/43 |

(Continued)

FOREIGN PATENT DOCUMENTS

| | | |
|---|---|---|
| KR | 10-0932205 | 12/2009 |
| KR | 10-2020-0034890 | 4/2020 |

(Continued)

*Primary Examiner* — Lin Li
(74) *Attorney, Agent, or Firm* — F. CHAU & ASSOCIATES, LLC

(57) ABSTRACT

A display device includes a display panel having a display area and a non-display area. The display panel includes a pixel disposed in the display area and including a light emitting element and a pixel driving circuit electrically connected with the light emitting element, a sensor disposed in the display area and including a photo sensing element and a sensor driving circuit electrically connected with the photo sensing element, a data line electrically connected with the pixel and extended along a first direction, a scan line electrically connected with the pixel and extended along a second direction intersecting the first direction, and a readout line including a first readout portion in the display area. The first readout portion is electrically connected with the sensor and extended along the second direction in the display area.

20 Claims, 19 Drawing Sheets

(51) Int. Cl.
  *G09G 3/36* (2006.01)
  *H01L 27/146* (2006.01)
  *H10K 59/131* (2023.01)
  *H10K 59/65* (2023.01)
(52) U.S. Cl.
  CPC ............ *G09G 2300/0861* (2013.01); *G09G 2320/0238* (2013.01); *H10K 59/65* (2023.02)

(56) References Cited

U.S. PATENT DOCUMENTS

| | | | |
|---|---|---|---|
| 2013/0162602 A1* | 6/2013 | Nakagawa | G06F 3/042 |
| | | | 345/175 |
| 2017/0115811 A1* | 4/2017 | Yang | G09G 3/3648 |
| 2019/0043420 A1* | 2/2019 | Jung | G06V 40/1318 |
| 2020/0089351 A1* | 3/2020 | Jeong | G06F 3/044 |
| 2020/0104563 A1 | 4/2020 | Ryu et al. | |
| 2020/0161493 A1* | 5/2020 | Lee | G06F 3/04184 |
| 2020/0185484 A1* | 6/2020 | Cho | H10K 59/131 |
| 2020/0211456 A1* | 7/2020 | Kim | G09G 3/3275 |
| 2020/0212137 A1* | 7/2020 | Wang | H10K 59/1213 |
| 2021/0019035 A1* | 1/2021 | Yoo | G06F 3/04166 |
| 2021/0158751 A1 | 5/2021 | Cha et al. | |
| 2021/0249495 A1 | 8/2021 | Lee et al. | |

FOREIGN PATENT DOCUMENTS

| KR | 10-2020-0082663 | 7/2020 |
|---|---|---|
| WO | 2020165686 | 8/2020 |

\* cited by examiner

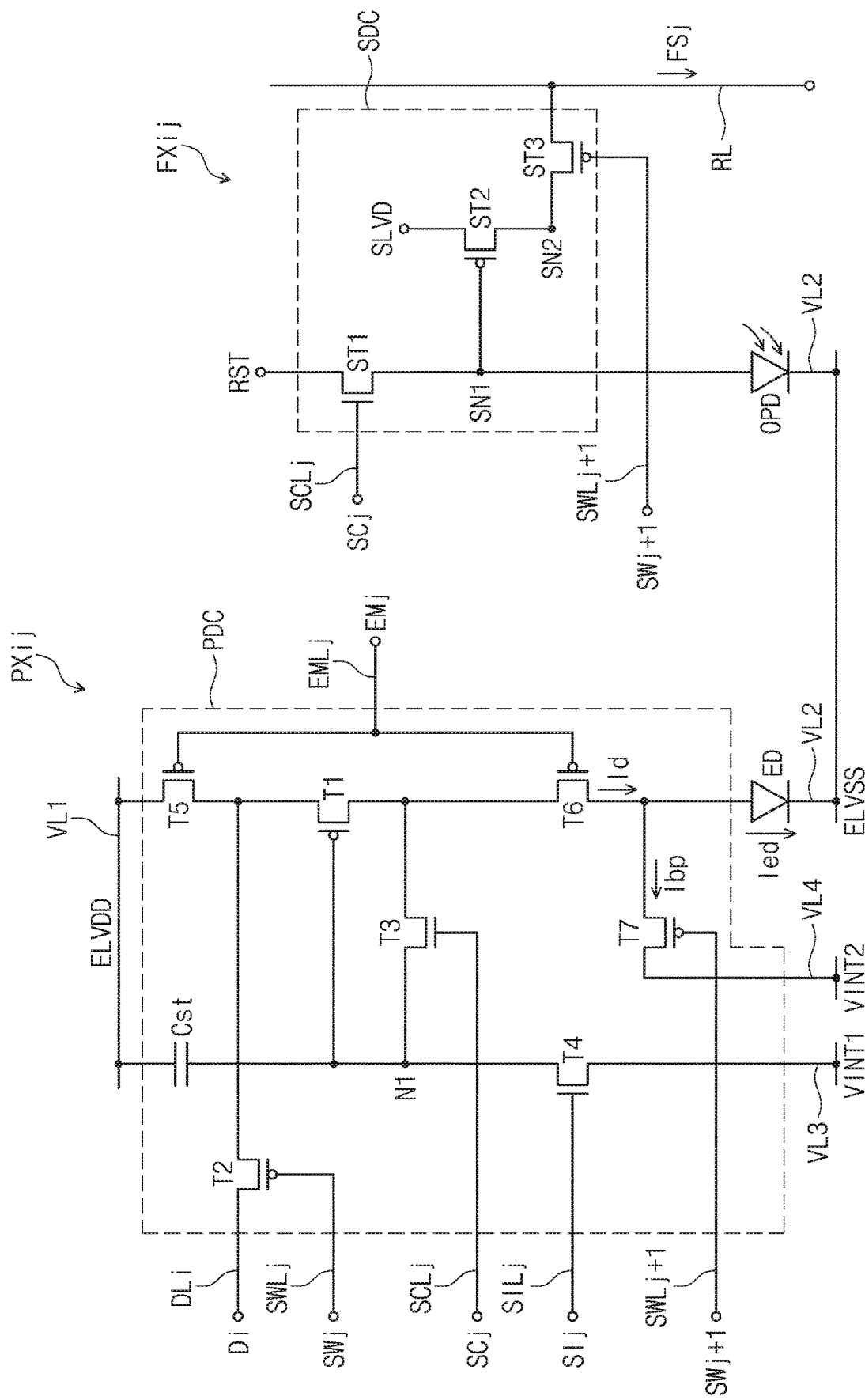

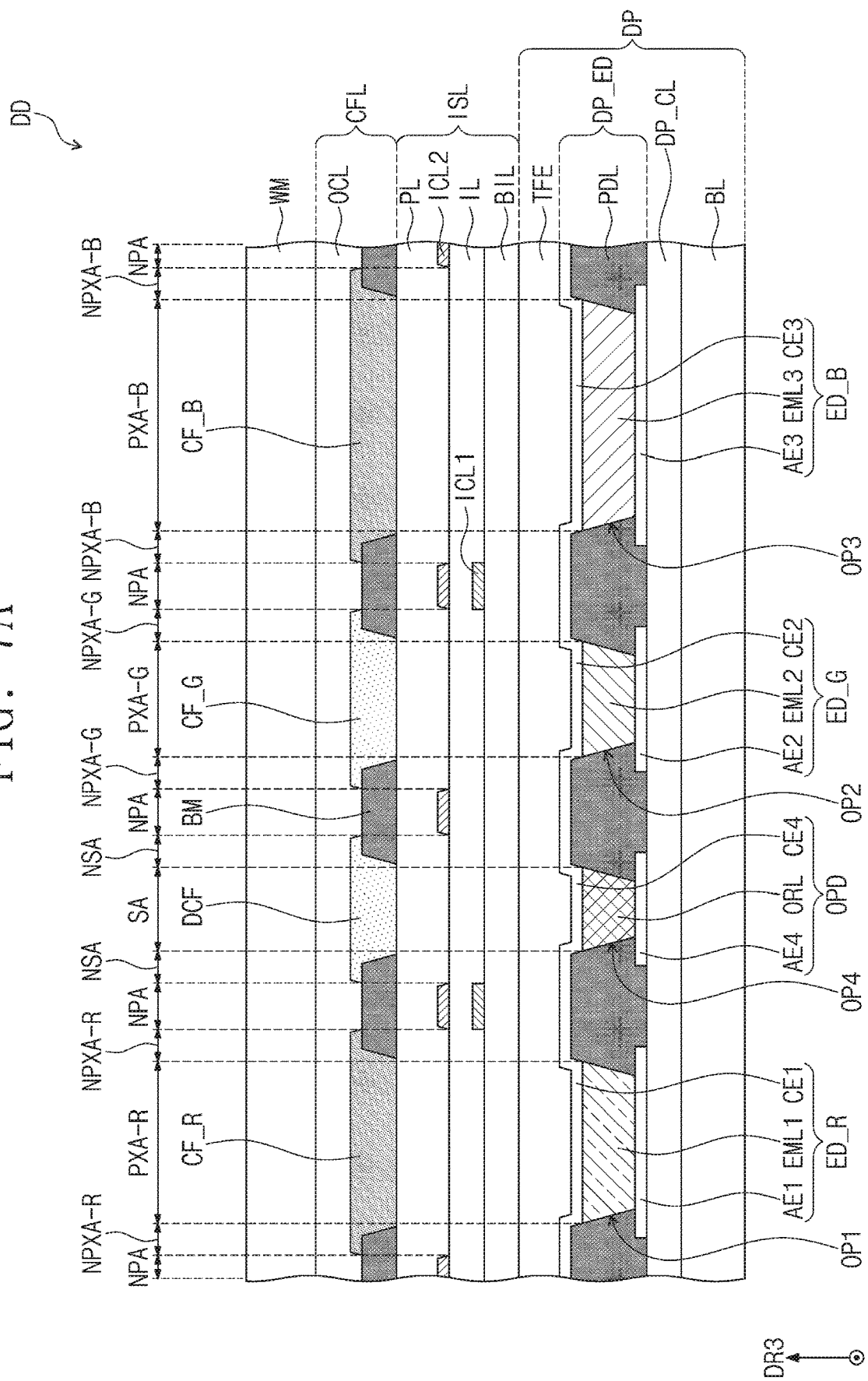

DISPLAY DEVICE

CROSS-REFERENCE TO RELATED APPLICATIONS

This application claims priority under 35 U.S.C. § 119 to Korean Patent Application No. 10-2021-0128445 filed on Sep. 29, 2021, in the Korean Intellectual Property Office, the disclosures of which are incorporated by reference herein in their entireties.

BACKGROUND

Embodiments of the present disclosure described herein relate to a display device, and more particularly, relate to a display device capable of recognizing biometric information.

A display device provides various functions capable of communicating with a user, for example, displaying an image to provide information to the user or detecting a user input. Recent display devices further include a function for detecting biometric information of the user. A biometric information recognition scheme may be a capacitive scheme for detecting a change in capacitance formed between electrodes, an optical scheme for detecting incident light using an optical sensor, an ultrasonic scheme for detecting vibration using a piezoelectric material or the like

SUMMARY

Embodiments of the present disclosure provide a display device with improved sensing performance of a sensor for recognizing biometric information.

According to an embodiment, a display device may include a display panel in which a display area and a non-display area are defined. The display panel may include a pixel disposed in the display area and including a light emitting element and a pixel driving circuit electrically connected with the light emitting element, a sensor disposed in the display area and including a photo sensing element and a sensor driving circuit electrically connected with the photo sensing element, a data line electrically connected with the pixel and extended along a first direction, a scan line electrically connected with the pixel and extended along a second direction intersecting the first direction, and a readout line including a first readout portion in the display area. The first readout portion is electrically connected with the sensor and is extended along the second direction in the display area.

The first readout portion of the readout line may not overlap the scan line in the display area. The first readout portion of the readout line and the scan line are parallel in the display area.

The first readout portion of the readout line may be extended along the second direction from the display area to the non-display area. The readout line may further include a second readout portion disposed in the non-display area and connected to the first readout portion at the non-display area, and extended along the first direction from the non-display area to the first readout portion.

The first readout portion and the second readout portion may be arranged on different layers from each other.

The display device may further include an input sensing layer disposed on the display panel and including a first conductive layer and a second conductive layer. A portion of the readout line may be included in the first conductive layer or the second conductive layer.

The first readout portion of the readout line may be extended along the second direction from the display area to the non-display area. The readout line may further include a second readout portion disposed in the non-display area and connected to the first readout portion at the non-display area and extended along the first direction from the non-display area to the first readout portion. The second readout portion may be included in the first conductive layer or the second conductive layer.

The display panel may further include a connection electrode connected with each of the first readout portion and the second readout portion.

The sensor driving circuit may include a reset transistor including a first electrode configured to receive a reset signal, a second electrode connected with a first sensing node, and a third electrode configured to receive a reset control signal, an amplification transistor including a first electrode configured to receive a sensing driving voltage, a second electrode connected with a second sensing node, and a third electrode connected with the first sensing node, and an output transistor including a first electrode connected with the second sensing node, a second electrode connected with the readout line, and a third electrode configured to receive an output control signal.

The display panel may further include a connection pattern electrically connecting the output transistor and the readout line with each other.

The connection pattern may be extended along the first direction. The connection pattern may be disposed on a layer different from the first readout portion.

The connection pattern and the second readout portion may be disposed on the same layer.

The scan line may be provided in plural. The plurality of scan lines may include an initialization scan line, a compensation scan line, and a write scan line, connected with the pixel. The first readout portion of the readout line may not overlap each of the initialization scan line, the compensation scan line, and the write scan line.

The pixel driving circuit may include a first transistor selectively connecting a first driving voltage line configured to receive a first driving voltage and the light emitting element, a second transistor selectively connecting the data line and a first electrode of the first transistor, a third transistor selectively connecting a second electrode of the first transistor and a first node and configured to receive a first scan signal, a fourth transistor selectively connecting a first initialization voltage line through which a first initialization voltage is applied and the first node and configured to receive a second scan signal, and a fifth transistor selectively connecting a second initialization voltage line through which a second initialization voltage is applied and an anode of the light emitting element and configured to receive a third scan signal.

The second initialization voltage line and the first readout portion of the readout line disposed in the display area may be disposed on the same layer.

According to an embodiment, a display device may include a display panel in which a display area and a non-display area are defined. The display panel may include a pixel disposed in the display area and including a light emitting element and a pixel driving circuit electrically connected with the light emitting element, a sensor disposed in the display area and configured to include a photo sensing element and a sensor driving circuit electrically connected with the photo sensing element, and a readout line electrically connected with the sensor and including a first readout portion in the display area and a second readout portion in the non-display area. The first readout portion and the second readout portion may be extended along different directions from each other. The first readout portion and the second readout portion may be arranged on different layers from each other.

The display panel may further include a scan line electrically connected with the pixel and extended along the same direction as an extending direction of the first readout portion and a data line electrically connected with the pixel and extended along the same direction as an extending direction of the second readout portion. The first readout portion may not overlap the scan line.

The pixel driving circuit may include a first transistor selectively connecting a first driving voltage line configured to receive a first driving voltage and the light emitting element, a second transistor selectively connecting the data line and a first electrode of the first transistor, a third transistor selectively connecting a second electrode of the first transistor and a first node and configured to receive a first scan signal, a fourth transistor selectively connecting a first initialization voltage line through which a first initialization voltage is applied and the first node and configured to receive a second scan signal, and a fifth transistor selectively connecting a second initialization voltage line through which a second initialization voltage is applied and an anode of the light emitting element and configured to receive a third scan signal. The first readout portion and the second initialization voltage line may be disposed on the same layer.

The display device may further include an input sensing layer disposed on the display panel and including a first conductive layer and a second conductive layer. The second readout portion may be included in the first conductive layer or the second conductive layer.

The sensor driving circuit may include a reset transistor including a first electrode configured to receive a reset signal, a second electrode connected with a first sensing node, and a third electrode configured to receive a reset control signal, an amplification transistor including a first electrode configured to receive a sensing driving voltage, a second electrode connected with a second sensing node, and a third electrode connected with the first sensing node, and an output transistor including a first electrode connected with the second sensing node, a second electrode connected with the readout line, and a third electrode configured to receive an output control signal.

The display panel may include a connection pattern electrically connecting the output transistor and the readout line with each other. The connection pattern may be extended along a direction different from an extending direction of the first readout portion. The connection pattern and the first readout portion may be disposed on different layers from each other.

According to an embodiment, a display device may include a display panel in which a display area and a non-display area are defined. The display panel may include a pixel disposed in the display area, a photo sensing element and a sensor driving circuit disposed in the display area and being electrically connected with each other, a data line electrically connected with the pixel and extending along a straight line extending along a first direction, a scan line electrically connected with the pixel and extending along a straight line extending in a second direction intersecting the first direction, and a readout line including a first readout portion in the display area and a second readout portion in the non-display area. The first readout portion may be electrically connected with the sensor and extend along a straight line extending in the second direction in the display area. The first readout portion of the readout line and the scan line may be parallel in the display area without overlapping each other. The second readout portion may be disposed in the non-display area and extend along a straight line extending in the first direction.

BRIEF DESCRIPTION OF THE FIGURES

The above and other objects and features of the present disclosure will become apparent by describing in detail embodiments thereof with reference to the accompanying drawings.

FIG. 5 is a circuit diagram illustrating a pixel and a sensor according to an embodiment of the present disclosure.

FIGS. 7A and 7B are cross-sectional views illustrating a light emitting element and a photo sensing element of a display panel according to an embodiment of the present disclosure.

DETAILED DESCRIPTION

Figure 1:
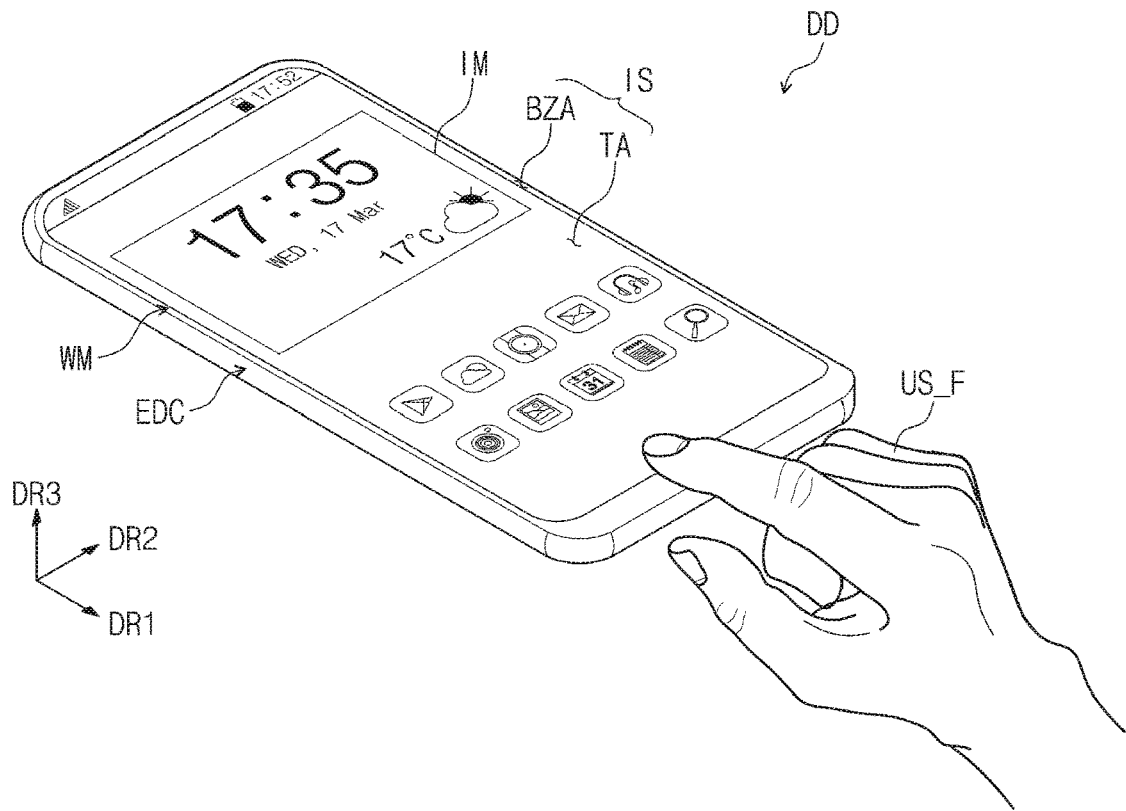
FIG. 1 is a perspective view of a display device according to an embodiment of the present disclosure.

In the specification, it will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The same reference numerals refer to the same components. Also, in the drawings, the thicknesses, the ratios, and the dimensions of the elements may be exaggerated for effective description of technical contents. The expression "and/or" includes one or more combinations which associated components are capable of defining.

Although the terms "first," "second," etc. may be used herein in describing various elements, such elements should not be construed as being limited by these terms. These terms are only used to distinguish one element from another element. For example, a first element could be termed a second element without departing from the scope of the claims of the present disclosure, and similarly a second element could be termed a first element. The singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the present disclosure will be described with reference to accompanying drawings.

Figure 2:
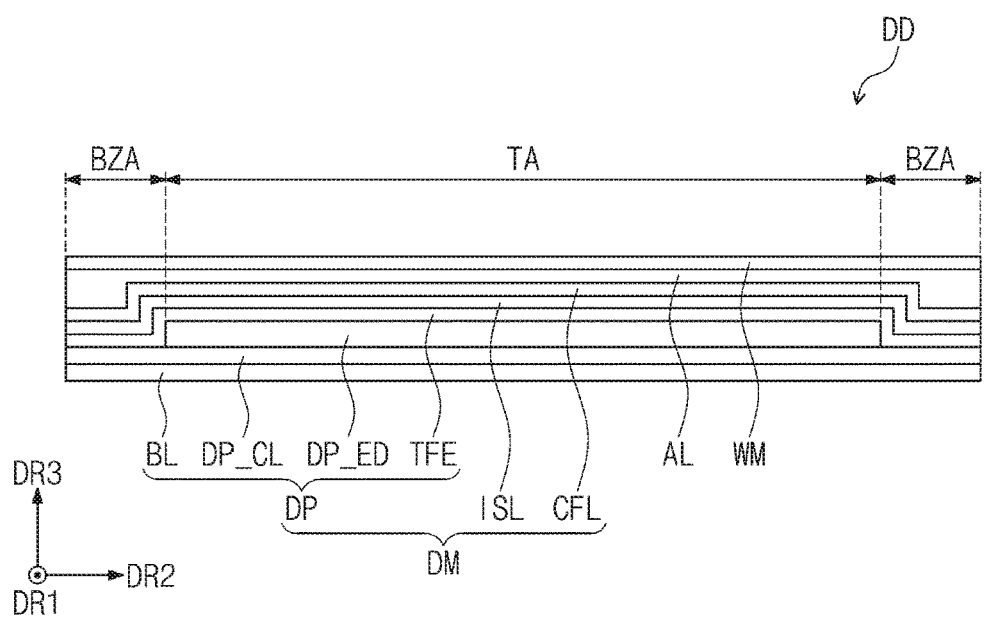
FIG. 2 is a cross-sectional view of a display device according to an embodiment of the present disclosure.

FIG. 1 is a perspective view of a display device according to an embodiment of the present disclosure. FIG. 2 is a cross-sectional view of a display device according to an embodiment of the present disclosure.

Referring to FIGS. 1 and 2, a display device DD may be a device which is activated according to an electrical signal. For example, the electronic device DD may be, but is not limited to, a mobile phone, a tablet, a car navigation system, a game console, or a wearable device. FIG. 1 illustrates that the electronic device DD is a mobile phone.

An upper surface of the display device DD may be defined as a display surface IS and may have a plane defined by a first direction DR1 and a second direction DR2. Images IM generated by the display device DD may be provided to a user through the display surface IS. Hereinafter, a normal direction substantially perpendicular to the plane defined by the first direction DR1 and the second direction DR2 may be defined as a third direction DR3. The meaning of "when viewed from a plan view" in the specification may refer to a state viewed from the third direction DR3.

The display surface IS may be divided into a transmission area TA and a bezel area BZA. The transmission area TA may be an area on which the images IM are displayed. A user may view the images IM through the transmission area TA. In an embodiment, the transmission area TA is illustrated in the shape of a quadrangle with rounded vertices. However, this is illustrated as an example. In an embodiment, the transmission area TA may have various shapes and is not limited to any one embodiment.

The bezel area BZA is adjacent to the transmission area TA. The bezel area BZA may have a certain color. The bezel area BZA surrounds the transmission area TA. Thus, the shape of the transmission area TA may be defined substantially by the bezel area BZA. However, this is illustrated as an example. In an embodiment, the bezel area BZA may be disposed adjacent to only one side of the transmission area TA or may be omitted.

The display device DD may detect an external input applied from the outside. The external input may be various types of inputs provided from the outside of the display device DD. For example, the external input may be an external input (e.g., hovering) applied by being close to the display device DD or being adjacent to the display device DD at a certain distance as well as a contact by a part of the body such as a hand US_F of the user. In an embodiment, the external input may have various forms such as force, pressure, temperature, and light.

The display device DD may detect biometric information of the user, which is applied from the outside. A biometric information sensing area capable of sensing biometric information of the user may be provided on the display surface IS of the display device DD. The biometric information sensing area may be provided on all of the transmission area TA or a portion of the transmission area TA. It is shown that all of the transmission area TA is used as the biometric information sensing area in FIG. 1, but the present invention is not limited thereto. In some embodiments, the biometric information sensing area may be provided on a portion of the transmission area TA.

The display device DD may include a window WM and a display module DM. The display module DM includes a display panel DP, an input sensing layer ISL, and an anti-reflection layer CFL.

The front surface of the window WM may define the display surface IS of the display device DD. The window WM may include or may be formed of an optically transparent insulating material. For example, the window WM may include or may be formed of glass or plastic. The window WM may be a multi-layered structure or a single-layered structure. For example, the window WM may include or may be formed of a plurality of plastic films bonded by an adhesive. In some embodiments, the window WM may include or may be formed of a glass substrate and a plastic film bonded by the adhesive.

The display panel DP may be a component which substantially generates an image. The display panel DP may be a light emitting display panel. For example, the display panel DP may be an organic light emitting display layer, an inorganic light emitting display layer, an organic-inorganic light emitting display layer, a quantum dot display layer, a micro-LED display layer, or a nano LED display layer.

The input sensing layer ISL may be disposed on the display panel DP. The input sensing layer ISL may detect an external input applied from the outside. The external input may be a user input. The user input may be various types of external inputs such as a part of the user's body, light, heat, a pen, pressure, or the like.

The input sensing layer ISL may be formed on the display panel DP through subsequent processes. In an embodiment, the input sensing layer ISL is directly disposed on the display panel DP. The expression "directly disposed" may mean that a third component is not disposed between the input sensing layer ISL and the display panel DP. In other words, a separate adhesive member may not be disposed between the input sensing layer ISL and the display layer DP. In an embodiment, the input sensing layer ISL may be coupled to the display panel DP by means of an adhesive member. The adhesive member may include a typical adhesive or sticking agent.

The anti-reflection layer CFL may be disposed on the input sensing layer ISL. The anti-reflection layer CFL may reduce a reflectivity of external light incident from the outside of the display panel DP. The anti-reflection layer CFL may be formed on the input sensing layer ISL through subsequent processes. The anti-reflection layer CFL may include color filters. The color filters may have certain arrangement. For example, the color filters may be arranged with regard to light emitting colors of pixels included in the display panel DP. In an embodiment, the anti-reflection layer CFL may further include a black matrix adjacent to the color filters.

Referring to FIG. 2, the display panel DP may include a base layer BL, a circuit layer DP_CL, a device layer DP_ED, and an encapsulation layer TFE. The display panel DP according to the present invention may be a flexible display panel. However, the present invention is not limited thereto. In an embodiment, the display panel DP may be a foldable display panel folded about a folding axis or a rigid display panel.

The base layer BL may have a synthetic resin layer. The synthetic resin layer may be a polyimide-based resin layer, and a material of the base layer BL is not particularly limited. In an embodiment, the base layer BL may include or may be a glass substrate, a metal substrate, an organic/inorganic composite substrate, or the like.

The circuit layer DP_CL may be disposed on the base layer BL. The circuit layer DP_CL may include at least one insulating layer and a circuit element. Hereinafter, the insulating layer included in the circuit layer DP_CL is referred to as an intermediate insulating layer. The intermediate insulating layer may include or may be formed of at least one intermediate inorganic layer and at least one intermediate organic layer. The circuit element may include a pixel driving circuit included in each of a plurality of pixels for displaying an image, a sensor driving circuit included in each of a plurality of sensors for recognizing external information, and the like. The external information may be biometric information. As an example of the present invention, the sensor may be a fingerprint sensor, a proximity sensor, an iris sensor, or the like. In an embodiment, the sensor may be an optical sensor which recognizes biometric information in an optical scheme. The circuit layer DP_CL may further include signal lines connected with the pixel driving circuit and the sensor driving circuit.

The device layer DP_ED may include a light emitting element included in each of pixels and a photo sensing element included in and each of sensors. As an example of the present invention, the photo sensing element may be a photodiode. The photo sensing element may be a sensor which senses or responds to light reflected by a fingerprint of the user. A description will be given in detail below of the circuit layer DP_CL and the device layer DP_ED with reference to FIGS. 6, 7A, and 7B.

The encapsulation layer TFE may seal the device layer DP_ED. The encapsulation layer TFE may include or may be formed of at least one organic layer and at least one inorganic layer. The inorganic layer may include or may be formed of an inorganic material and may protect the device layer DP_ED from moisture/oxygen. The inorganic layer may include, but is not particularly limited to, a silicon nitride layer, a silicon oxynitride layer, a silicon oxide layer, a titanium oxide layer, an aluminum oxide layer, or the like. The organic layer may include or may be formed of an organic material and may protect the device layer DP_ED from foreign substances such as dust particles. The organic layer may include, but is not particularly limited to, an acrylic-based organic material.

The display device DD according to an embodiment of the present invention may further include an adhesive layer AL. The window WM may be attached to the anti-reflection layer CFL by the adhesive layer AL. The adhesive layer AL may include an optical clear adhesive, an optically clear adhesive resin, or a pressure sensitive adhesive (PSA).

Figure 3:
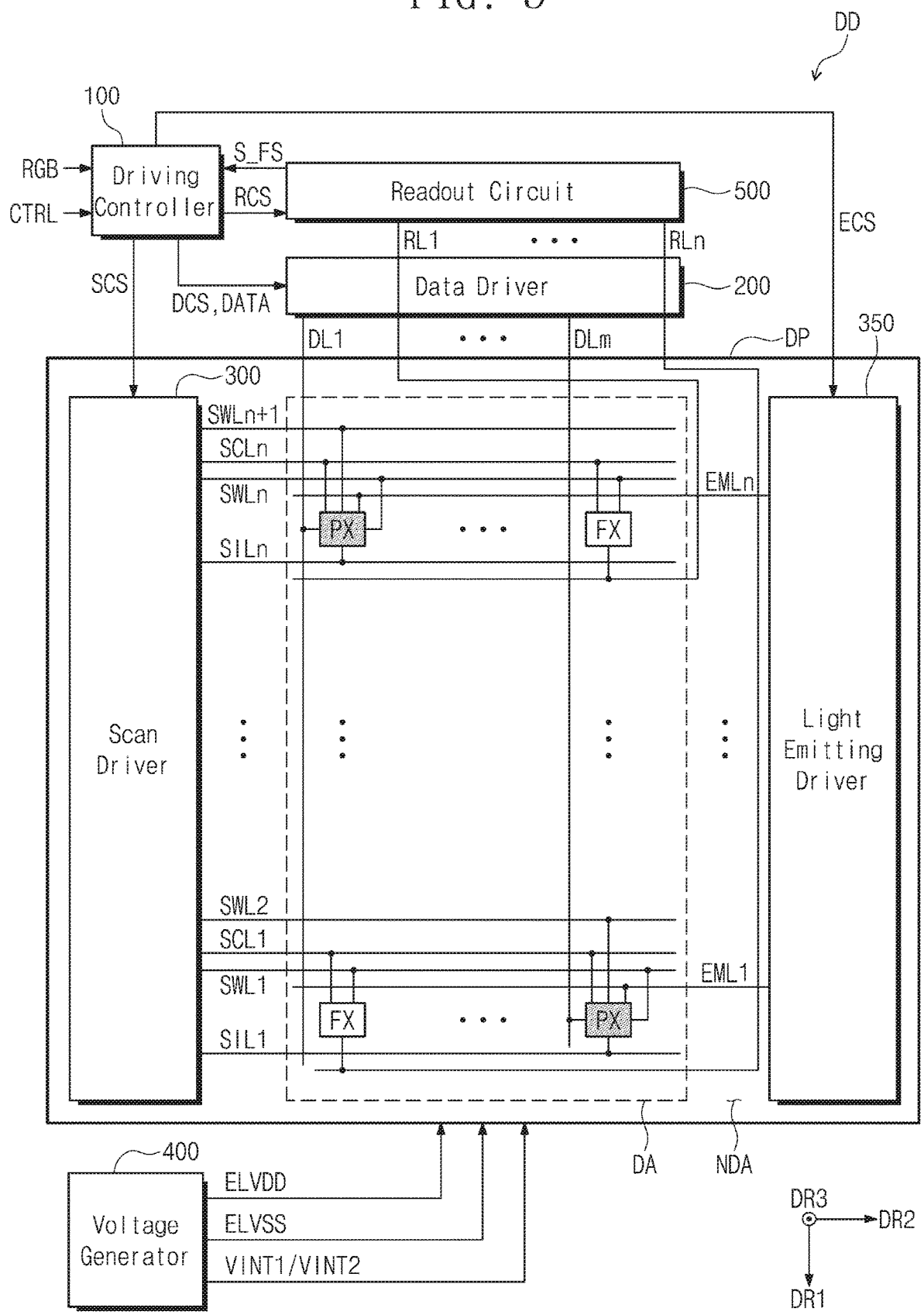
FIG. 3 is a block diagram of a display device according to an embodiment of the present disclosure.
Figure 4A:
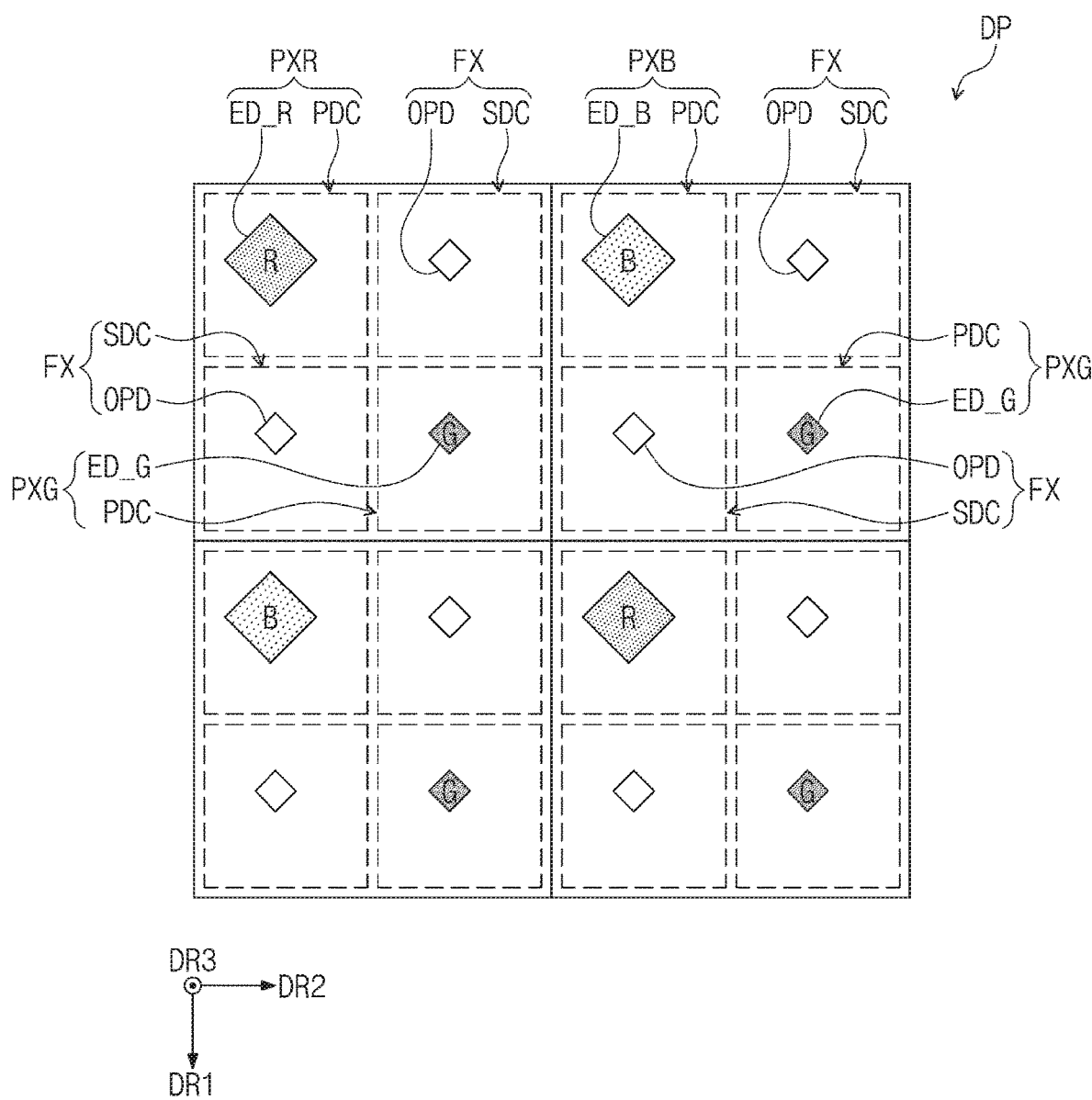
FIGS. 4A, 4B, and 4C are plan views expanding a partial area of a display panel according to embodiments of the present disclosure.
Figure 4B:
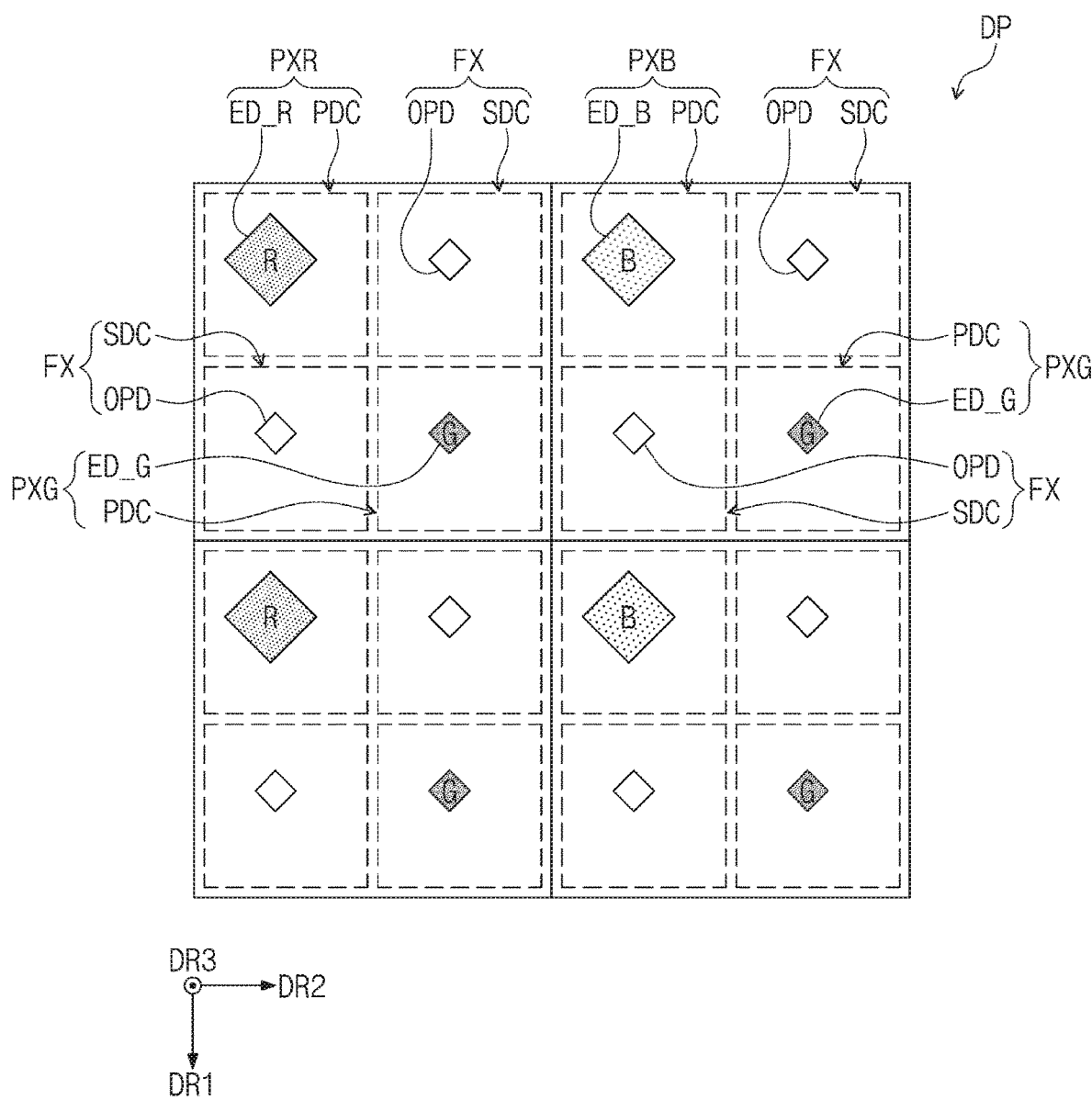
Figure 4C:
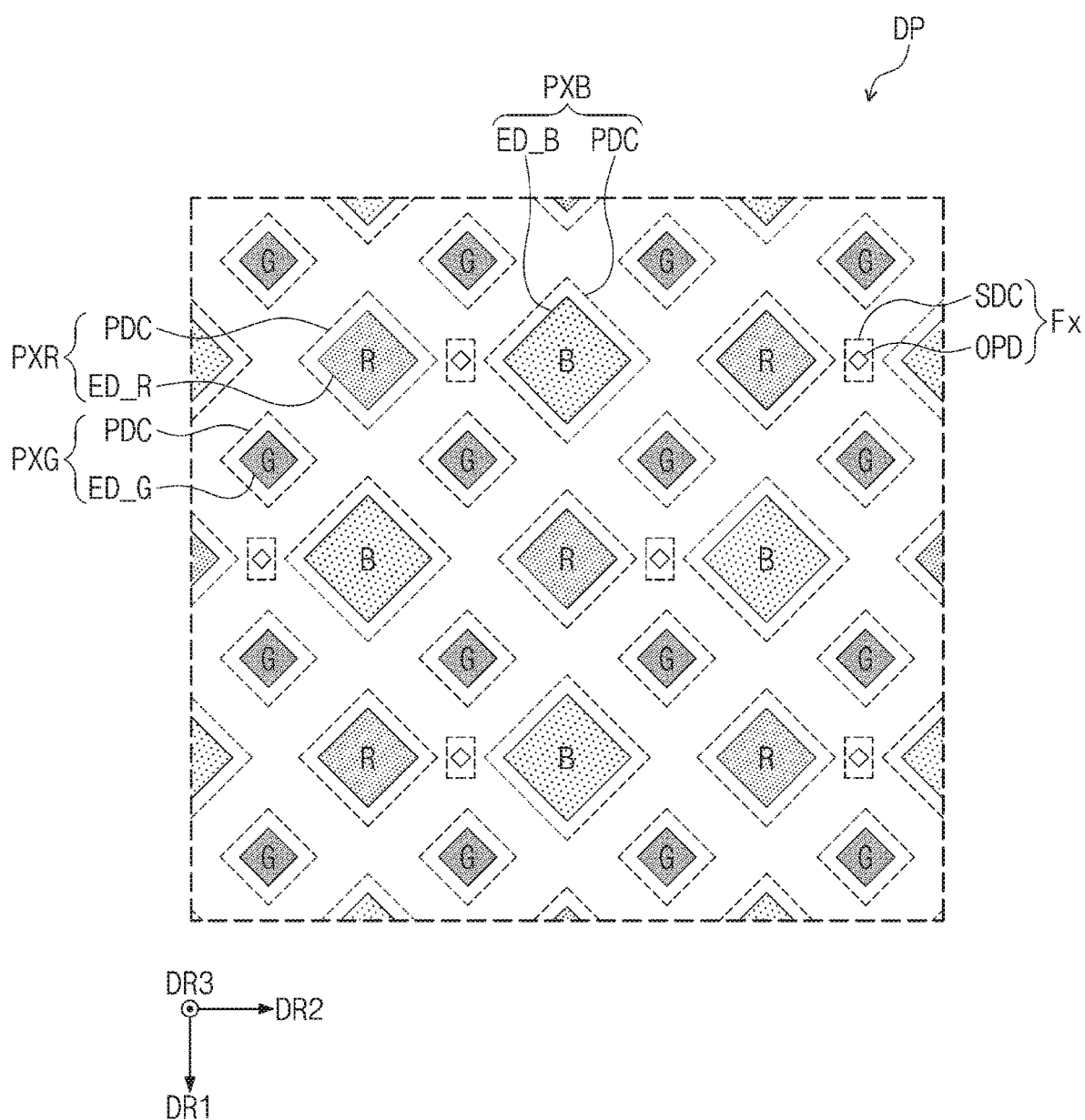

FIG. 3 is a block diagram of a display device according to an embodiment of the present invention. FIGS. 4A to 4C are plan views expanding a partial area of a display panel according to embodiments of the present invention.

Referring to FIG. 3, a display device DD may include a display panel DP, a panel driver, and a driving controller 100. As an example of the present invention, the panel driver may include a data driver 200, a scan driver 300, a light emitting driver 350, a voltage generator 400, and a readout circuit 500.

The driving controller 100 may receive an image signal RGB and a control signal CTRL. The driving controller 100 may generate an image data signal DATA by converting a data format of the image signal RGB to suit interface specifications with the data driver 200. The driving controller 100 may output a first control signal SCS, a second control signal ECS, a third control signal DCS, and a fourth control signal RCS.

The data driver 200 may receive the third control signal DCS and the image data signal DATA from the driving controller 100. The data driver 200 may convert the image data signal DATA into data signals and may output the data signals to a plurality of data lines DL1-DLm which will be described below. The data signals may be analog voltages corresponding to a gray scale value of the image data signal DATA.

The scan driver 300 may receive the first control signal SCS from the driving controller 100. The scan driver 300 may output scan signals to scan lines in response to the first control signal SCS.

The voltage generator 400 may generate voltages necessary for an operation of the display panel DP. In an embodiment, the voltage generator 400 generates a first driving voltage ELVDD, a second driving voltage ELVSS, a first initialization voltage VINT1, and a second initialization voltage VINT2.

The display panel DP may include a display area DA corresponding to a transmission area TA (refer to FIG. 1) and a non-display area NDA corresponding to a bezel area BZA (refer to FIG. 1).

The display panel DP may include a plurality of pixels PX arranged in the display area DA and a plurality of sensors FX arranged in the display area DA. The plurality of pixels PX and the plurality of sensors FX may be arranged to have a certain rule. For example, two pixels PX and one sensor FX may be repeatedly arranged in a second direction DR2. In an embodiment, one pixel PX and one sensor FX may be alternately repeated and arranged in a first direction DR1 and the second direction DR2. However, the arrangement relationship is not limited thereto. In an embodiment, an arrangement relationship between the pixels PX and the sensors FX may be modified in various manners.

The display panel DP may further include scan lines, light emitting control lines EML1-EMLn, data lines DL1-DLm, and readout lines RL1-RLn. The scan lines may include initialization scan lines SIL1-SILn, compensation scan lines SCL1-SCLn, and write scan lines SWL1-SWLn. The initialization scan lines SIL1-SILn, the compensation scan lines SCL1-SCLn, the write scan lines SWL1-SWLn, and the light emitting control lines EML1-EMLn may be extended in the second direction DR2. The initialization scan lines SIL1-SILn, the compensation scan lines SCL1-SCLn, the write scan lines SWL1-SWLn, and the light emitting control lines EML1-EMLn may be arranged spaced apart from each other in the first direction DR1. The data lines DL1-DLm may be extended in the first direction DR1 and may be arranged spaced apart from each other in the second direction DR2.

According to an embodiment of the present disclosure, the readout lines RL1-RLn may be extended along the second direction DR2 in the display area DA and may be arranged spaced apart from each other in the first direction DR1. In other words, the readout lines RL1-RLn may be extended in the same direction as each of the initialization scan lines SIL1-SILn, the compensation scan lines SCL1-SCLn, the write scan lines SWL1-SWLn, and the light emitting control lines EML1-EMLn.

The readout lines RL1-RLn may fail to intersect the initialization scan lines SIL1-SILn, the compensation scan lines SCL1-SCLn, the write scan lines SWL1-SWLn, and the light emitting control lines EML1-EMLn. Thus, coupling generated between the readout lines RL1-RLn and the initialization scan lines SIL1-SILn, the compensation scan lines SCL1-SCLn, the write scan lines SWL1-SWLn, and the light emitting control lines EML1-EMLn in the display area DA may be minimized. In other words, distortion generated in a sensing signal delivered through the readout lines RL1-RLn may be reduced or removed. As a result, fingerprint sensing performance of a display device DD (refer to FIG. 1) may be improved.

The plurality of pixels PX may be respectively and electrically connected with the initialization scan lines SIL1-SILn, the compensation scan lines SCL1-SCLn, the write scan lines SWL1-SWLn, the light emitting control lines EML1-EMLn, and the data lines DL1-DLm. Each of the plurality of pixels PX may be electrically connected with four scan lines. For example, as shown in FIG. 3, a first row of pixels PX may be connected with the first initialization scan line SIL1, the first compensation scan line SCL1, the first write scan line SWL1, and the second write scan line SWL2. An nth row of pixels PX may be connected with the nth initialization scan line SILn, the nth compensation scan line SCLn, the nth write scan line SWLn, and the n+1 write scan line SWLn+1.

The plurality of sensors FX may be respectively and electrically connected with the compensation scan lines SCL1-SCLn, the write scan lines SWL1-SWLn, the readout lines RL1-RLn. Each of the plurality of sensors FX may be electrically connected with two scan lines. For example, as shown in FIG. 3, a first row of sensors FX may be connected with the first compensation scan line SCL1 and the second write scan line SWL2. An nth row of sensors FX may be connected with the nth compensation scan line SCLn and the n+1th write scan line SWLn+1.

The scan driver 300 may be disposed in the non-display area NDA of the display panel DP. The scan driver 300 may receive the first control signal SCS from the driving controller 100. The scan driver 300 may output initialization scan signals to the initialization scan lines SIL1-SILn and may output compensation scan signals to the compensation scan lines SCL1-SCLn, in response to the first control signal SCS. The scan driver 300 may output write scan signals to write scan lines SWL1-SWLn in response to the first control signal SCS. In an embodiment, the scan driver 300 may include first and second scan drivers. The first scan driver may output initialization scan signals and compensation scan signals, and the second scan driver may output write scan signals.

The light emitting driver 350 may be disposed in the non-display area NDA of the display panel DP. The light emitting driver 350 may receive the second control signal ECS from the driving controller 100. The light emitting driver 350 may output light emitting control signals to light emitting control lines EML1-EMLn in response to the second control signal ECS. In an embodiment, the scan driver 300 may be connected with the light emitting control lines EML1-EMLn. The scan driver 300 may output light emitting control signals to the light emitting control lines EML1-EMLn.

The readout circuit 500 may receive the fourth control signal RCS from the driving controller 100. The readout circuit 500 may receive sensing signals from the readout lines RL1-RLn, in response to the fourth control signal RCS. The readout circuit 500 may process sensing signals received from the readout lines RL1-RLn and may provide the driving controller 100 with the processed sensing signals S_FS. The driving controller 100 may recognize biometric information based on the sensing signals S_FS.

As shown in FIGS. 4A to 4C, the display panel DP may include pixels PXR, PXB, and PXG and sensors FX. Each of the pixels PXR, PXB, and PXG may include light emitting elements ED_R, ED_G, and ED_B and a pixel driving circuit PDC. Each of the sensors FX may include a photo sensing element OPD and a sensor driving circuit SDC.

The pixels PXR, PXB, and PXG and the sensors FX may be alternately arranged in the first direction DR1 and may be alternately arranged in the second direction DR2. The pixels PXR, PXB, and PXG may include first pixels PXR including a light emitting element (hereinafter, referred to as a "first light emitting element ED_R") which outputs light of a first color (e.g., red R), second pixels PXG including a light emitting element (hereinafter, referred to as a second light emitting element ED_G) which output light of a second color (e.g., green G), and third pixels PXB including a light emitting element (hereinafter, referred to as a third light emitting element ED_B) which outputs light of a third color (e.g., blue B).

As shown in FIG. 4A, on first and second directions DR1 and DR2, the first pixels PXR and the third pixels PXB may be alternately and repeatedly arranged. The second pixels PXG may be arranged along the first and second directions DR1 and DR2.

On the first and second directions DR1 and DR2, each of the sensors FX may be disposed between the first pixel PXR and the third pixel PXB, which are adjacent to each other. On the first and second directions DR1 and DR2, each of the sensors FX may be disposed between two second pixels PXG. However, the arrangement structure of the pixels PXR, PXB, and PXG and the sensors FX is not limited thereto. In an embodiment, the arrangement structure of the pixels PXR, PXB, and PXG may be modified in various manners.

As shown in FIG. 4B, on the first direction DR1, each of the sensors FX may be disposed between two first pixels PXR, between two second pixels PXG, and between two third pixels PXB. On the second direction DR2, each of the sensors FX may be disposed between the first pixel PXR and the third pixel PXB, which are adjacent to each other, and between two second pixels PXG. The arrangement structure of the pixels PXR, PXB, and PXG and the sensors FX may be modified in various manners.

For example, the first pixels PXR and the third pixels PXB may be arranged in different columns or different rows. When the first pixels PXR are arranged in odd-numbered columns, the third pixels PXB may be arranged in even-numbered columns. When the first pixels PXR are arranged in odd-numbered rows, the third pixels PXB may be arranged in even-numbered rows. At least one second pixel PXG and at least one sensor FX may be arranged between two first pixels PXR which are adjacent to each other on the first and second directions DR1 and DR2. At least one second pixel PXG and at least one sensor FX may be arranged between two third pixels PXB which are adjacent to each other on the first and second directions DR1 and DR2.

As shown in FIG. 4C, on the first and second directions DR1 and DR2, the first pixels PXR and the third pixels PXB may be alternately and repeatedly arranged. The second pixels PXG may be arranged along the first and second directions DR1 and DR2. On the first direction DR1, each of the sensors FX may be arranged between two second pixels PXG and may be arranged between the first pixel PXR and the third pixel PXB which are adjacent to each other on the second direction DR2. For example, one sensor FX may be disposed per unit group composed of one first pixel PXR, two second pixels PXG, and one third pixel PXB. The arrangement structure of the pixels PXR, PXB, and PXG and the sensors FX may be modified in various manners.

As one example of the present invention, a first light emitting element ED_R may have a size which is larger than a second light emitting element ED_G. A third light emitting element ED_B may have a size which is larger than or the same as the first light emitting element ED_R. A size of each of the first to third light emitting elements ED_R, ED_G, and ED_B is not limited thereto, and may be modified and applied in various manners. In an embodiment, the first to third light emitting elements ED_R, ED_G, and ED_B may have the same size as each other.

In an embodiment, each of the first to third light emitting elements ED_R, ED_G, and ED_B has a square shape. The present invention, however, is not limited thereto. In an embodiment, each of the first to third light emitting elements ED_R, ED_G, and ED_B may have various shapes such as a polygon, a circle, an oval, and the like. In an embodiment, the shapes of the first to third light emitting elements ED_R, ED_G, and ED_B may be different from each other. For example, the second light emitting element ED_G may have a circle shape, and each of the first and third light emitting elements ED_R and ED_B may have a square shape.

The photo sensing element OPD may have a size which is smaller than the first and third light emitting elements ED_R and ED_B. As one example of the present invention, the photo sensing element OPD may have a size which is smaller than or the same as a second light emitting element ED_G. However, the size of the photo sensing element OPD is not limited thereto. In an embodiment, the size of the photo sensing element OPD may be variously modified and applied. The photo sensing element OPD has a square shape, but the present invention is not limited thereto. In an embodiment, the photo sensing element OPD may have various shapes such as a polygon, a circle, an oval, and the like.

Each of the first to third light emitting elements ED_R, ED_G, and ED_B may be electrically connected with a corresponding pixel driving circuit PDC. The pixel driving circuit PDC may include a plurality of transistors and a capacitor. The pixel driving circuits PDC respectively connected with the first to third light emitting elements ED_R, ED_G, and ED_B may have the same configuration.

The photo sensing element OPD may be electrically connected with a sensor driving circuit SDC. The sensor driving circuit SDC may include a plurality of transistors. As an example of the present invention, the sensor driving circuit SDC and the pixel driving circuit PDC may be formed at the same time through the same process. In an embodiment, the scan driver 300 may include transistors formed through the same process as the pixel driving circuit PDC and the sensor driving circuit SDC.

The pixel driving circuit PDC may receive the first driving voltage ELVDD, the second driving voltage ELVSS, and the first and second initialization voltages VINT1 and VINT2 from the voltage generator 400. The sensor driving circuit SDC may receive at least one of the first driving voltage ELVDD, the second driving voltage ELVSS, the first initialization voltage VINT1, and the second initialization voltage VINT2 from the voltage generator 400.

FIG. 5 is a circuit diagram illustrating a pixel and a sensor according to an embodiment of the present invention.

An equivalent circuit diagram of one pixel PXij among the plurality of pixels PX illustrated in FIG. 3 is illustrated as an example in FIG. 5. Because each of the plurality of pixels PX has the same circuit structure, a circuit structure of the pixel PXij will be described and a detailed description of the remaining pixels will be omitted. An equivalent circuit diagram of one sensor FXij among a plurality of sensors FX illustrated in FIG. 3 is illustrated as an example in FIG. 5. Because each of the plurality of sensors FX has the same circuit structure, a circuit structure of the sensor FXij will be described and a detailed description of the remaining sensors will be omitted.

Referring to FIG. 5, the pixel PXij may be connected with an ith data line DLi among data lines DL1-DLm, an jth initialization scan line SILj among initialization scan lines SIL1-SILn, a jth compensation scan line SCLj among compensation scan lines SCL1-SCLn, a jth write scan line SWLj and a j+1st write scan line SWLj+1 among write scan lines SWL1-SWLn, and a jth light emitting control line EMLj among light emitting control lines EML1-EMLn.

The pixel PXij may include a light emitting element ED and a pixel driving circuit PDC. The light emitting element ED may be a light emitting diode. As an example of the present disclosure, the light emitting element ED may be an organic light emitting diode including an organic light emitting layer.

The pixel driving circuit PDC may include first to seventh transistors T1, T2, T3, T4, T5, T6, and T7, and one storage capacitor Cst. The first to seventh transistors T1, T2, T3, T4, T5, T6, and T7 may be referred to as the driving thin-film transistor (TFT) T1, the switching TFT T2, the compensation TFT T3, the first initialization TFT T4, the operation control TFT T5, the light emitting control TFT T6, and the second initialization TFT T7, respectively.

At least one of the first to seventh transistors T1, T2, T3, T4, T5, T6, and T7 may be a transistor having a low-temperature polycrystalline silicon (LTPS) semiconductor layer. Some of the first to seventh transistors T1, T2, T3, T4, T5, T6, and T7 may be P-type transistors, the others may be N-type transistors. For example, the first, second, fifth, sixth, and seventh transistors T1, T2, T5, T6, and T7 may be PMOS transistors, and the third and fourth transistors T3 and T4 may be NMOS transistors. At least one of the first to seventh transistors T1, T2, T3, T4, T5, T6, and T7 may be a transistor having an oxide semiconductor layer.

In an embodiment, the first transistor T1 which has a direct influence on or serves to control a brightness of the display device may include a semiconductor layer composed of polycrystalline silicon having high reliability, thus implementing a high-resolution display device.

The oxide semiconductor has high carrier mobility and a low leakage current, and thus a voltage drop of the oxide semiconductor is not large although a driving time thereof is long. In other words, because a change in color of an image according to a voltage drop is not large even when driving at low frequencies, the driving at low frequencies is possible.

The oxide semiconductor has advantages of low leakage current. In an embodiment, at least one of the third transistor T3 and the fourth transistor T4 connected with a driving gate electrode of the first transistor T1 may include an oxide semiconductor to reduce power consumption and to prevent a leakage current flowing to the driving gate electrode. The first, second, fifth, sixth, and seventh transistors T1, T2, T5, T6, and T7 may be LTPS transistors.

A configuration of the pixel driving circuit PDC according to the present disclosure is not limited to the embodiment illustrated in FIG. 5. The pixel driving circuit PDC illustrated in FIG. 5 is only an example, and the configuration of the pixel driving circuit PDC may be modified and implemented. In an embodiment, all the first to seventh transistors T1, T2, T3, T4, T5, T6, and T7 may be P-type transistors or N-type transistors.

The jth initialization scan line SILj, the jth compensation scan line SCLj, the jth write scan line SWLj, the j+1 write scan line SWLj+1, and the jth light emitting control line EMLj may deliver a jth initialization scan signal SIj, a jth compensation scan signal SCj, a jth write scan signal SWj, a j+1st write scan signal SWj+1, and a jth light emitting control signal EMj to a pixel PXij, respectively. An ith data line DLi may deliver an ith data signal Di to the pixel PXij. The ith data signal Di may have a voltage level corresponding to an image signal RGB (refer to FIG. 3) input to a display device DD (refer to FIG. 3).

A first driving voltage line VL1 and a second driving voltage line VL2 may deliver the first driving voltage ELVDD and the second driving voltage ELVSS to the pixel PXij, respectively. A first initialization voltage line VL3 and a second initialization voltage line VL4 may deliver the first initialization voltage VINT1 and the second initialization voltage VINT2 to the pixel PXij, respectively.

The first transistor T1 may be connected between the first driving voltage line VL1 for receiving the first driving voltage ELVDD and the light emitting element ED. The first transistor T1 may include a first electrode connected with the first driving voltage line VL1 via the fifth transistor T5, a second electrode electrically connected with an anode of the light emitting diode ED via the sixth transistor T6, and a third electrode connected with one end of the storage capacitor Cst. The first transistor T1 may receive the data signal Di delivered by the ith data line DLi depending on the switching operation of the second transistor T2 and may supply a driving current Id to the light emitting element ED.

The second transistor T2 may be connected between the data line DLi and the first electrode of the first transistor T1. The second transistor T2 may include a first electrode connected with the data line DLi, a second electrode connected with the first electrode of the first transistor T1, and a third electrode connected with the jth write scan line SWLj. The second transistor T2 may be turned on according to the write scan signal SWj delivered through the jth write scan line SWLj to deliver the ith data signal Di, delivered from the ith data line DLi, to the first electrode of the first transistor T1.

The third transistor T3 may be connected between the second electrode of the first transistor T1 and the first node N1. The third transistor T3 may include a first electrode connected with the third electrode of the first transistor T1, a second electrode connected with the second electrode of the first transistor T1, and a third electrode connected with the jth compensation scan line SCLj. The third transistor T3 may be turned on according to the jth compensation scan signal SCj delivered through the jth compensation scan line SCLj to connect the third electrode of the first transistor T1 and the second electrode of the first transistor T1, thus diode-connecting the first transistor T1.

The fourth transistor T4 may be connected between the first initialization voltage line VL3 through which the first initialization voltage VINT1 is applied and the first node N1. The fourth transistor T4 includes a first electrode connected with the third electrode of the first transistor T1, a second electrode connected with the first initialization voltage line VL3 through which the first initialization voltage VINT1 is supplied, and a third electrode connected with the jth initialization scan line SILj. The fourth transistor T4 may be turned on according to the jth initialization scan signal SIj delivered through the jth initialization scan line SILj. The fourth transistor T4 turned on may transfer the first initialization voltage VINT1 to the third electrode of the first transistor T1 to initialize a potential of the third electrode of the first transistor T1 (i.e., a potential of the first node N1).

The fifth transistor T5 may include a first electrode connected with the first driving voltage line VL1, a second electrode connected with the first electrode of the first transistor T1, and a third electrode connected with the jth light emitting control line EMLj.

The sixth transistor T6 may include a first electrode connected with the second electrode of the first transistor T1, a second electrode connected with the anode of the light emitting diode ED, and a third electrode connected with the jth light emitting control line EMLj.

The fifth and sixth transistors T5 and T6 are simultaneously turned on according to the jth light emitting control signal EMj delivered through the jth light emitting control line EMLj. The first driving voltage ELVDD applied through the fifth transistor T5 turned on may be compensated through the diode-connected first transistor T1 to be transferred to the light emitting element ED.

The seventh transistor T7 may include a first electrode connected with the second initialization voltage line VL4 through which the second initialization voltage VINT2 is transferred, a second electrode connected with the second electrode of the sixth transistor T6, and a third electrode connected with the j+1th write scan line SWLj+1. The second initialization voltage VINT2 may have a level which is lower than or the same as the first initialization voltage VINT1. As an example of the present invention, each of the first and second initialization voltages VINT1 and VINT2 may have a voltage of −3.5 V.

As described above, one end of the storage capacitor Cst may be connected with the third electrode of the first transistor T1, and the other end of the capacitor Cst may be connected with the first driving voltage line VL1. The cathode of the light emitting element ED may be connected with the second driving voltage line VL2 which supplies the second driving voltage ELVSS. The second driving voltage ELVSS may have a level lower than the first driving voltage ELVDD. As an example of the present invention, the second driving voltage ELVSS may have a voltage level lower than the first and second initialization voltages VINT1 and VINT2.

When the jth initialization scan signal SIj of a high level is provided through the jth initialization scan line SILj, during an activation interval of the jth initialization scan signal SIj, the fourth transistor T4 may be turned on in response to the jth initialization scan signal SIj of the high level. The first initialization voltage VINT1 is transferred to the third electrode of the first transistor T1 through the fourth transistor T4 turned on, and the first node N1 is initialized to the first initialization voltage VINT1. Thus, the activation interval of the jth initialization scan signal SIj may be an initialization interval of the pixel PXij.

Next, when the jth compensation scan signal SCj is activated and when the jth compensation scan signal SCj of the high level is provided through the jth compensation scan signal SCLj, during an activation interval of the jth compensation scan signal SCj, the third transistor T3 may be turned on. The first transistor T1 may be diode-connected by the third transistor T3 turned on and may be forward biased.

The jth write scan signal SWj may be activated in the activation interval of the jth compensation scan signal SCj. The jth write scan signal SWj may have a low level during the activation interval. During the activation interval of the jth write scan signal SWj, the second transistor T2 may be turned on by the jth write scan signal SWj of a low level. Then, a compensation voltage ("Di-Vth"), in which the ith data signal Di provided from the ith data line DLi decreases by a threshold voltage Vth of the first transistor T1, may be applied to the third electrode of the first transistor T1. In other words, a potential of the third electrode of the first transistor T1 may be the compensation voltage ("Di-Vth").

As the first driving voltage ELVDD and the compensation voltage ("Di-Vth") are applied to opposite ends of the storage capacitor Cst, charges corresponding to a voltage difference of the opposite ends may be stored in the storage capacitor Cst. Herein, the high level interval of the jth compensation scan signal SCj may be referred to as a compensation interval of the pixel PXij.

The j+1th write scan signal SWj+1 may be activated in the activation interval of the jth compensation scan signal SCj. The seventh transistor T7 may be turned on, during the activation interval of the j+1 write scan signal SWj+1. A portion of the driving current Id may be drained through the seventh transistor T7 as a bypass current Ibp by the seventh transistor T7.

When the light emitting diode ED emits light and a minimum current of the first transistor T1, which displays a black image, flows as a driving current, the black image may fail to be properly displayed. Thus, the seventh transistor T7 in the pixel PXij according to an embodiment of the present invention may disperse (i.e., bypass) a portion of the minimum current of the first transistor T1 to a current path, which is different from a current path to the light emitting diode ED, as the bypass current Ibp. Herein, the minimum current of the first transistor T1 refers to a current flowing under the condition that, a gate-source voltage Vgs of the first transistor T1 is smaller than the threshold voltage Vth so that the first transistor T1 is turned off. Under the condition that the first transistor T1 is turned off, a minimum driving current (e.g., a current of 10 picoampere (pA) or less) flows into the light emitting diode ED to represent an image of black luminance. The influence of a bypass transfer of the bypass current Ibp may be large when the minimum driving current displaying a black image flows, whereas there may be almost no influence of the bypass current Ibp when a large driving current displaying an image such as a normal image or a white image flows. Thus, when a driving current ld displaying a black image flows, a light emitting current led of the light emitting diode ED, in which the driving current Id decreases by the amount of the bypass current Ibp drained through the seventh transistor T7, may have a minimum current to such an extent as to accurately express the black image. Thus, a contrast ratio may be improved by implementing an accurate black luminance image using the seventh transistor T7.

Next, the jth light emitting control signal EMj provided from the jth light emitting control line EMLj may change from a high level to a low level. The fifth and sixth transistors T5 and T6 may be turned on by the light emitting control signal EMj of the low level. Then, the driving current Id may be generated according to a voltage difference between a voltage of the third electrode of the first transistor T1 and the first driving voltage ELVDD and may be supplied to the light emitting element ED through the sixth transistor T6, and the current led may flow into the light emitting element ED.

Referring to FIG. 5, a sensor FXij may be connected with the readout line RL, the jth compensation scan line SCLj, and the j+1st write scan line SWLj+1. The sensor FXij may be further connected with the second driving voltage line VL2.

The sensor FXij may include a photo sensing element OPD and a sensor driving circuit SDC. The photo sensing element OPD may be a photodiode. As an example of the present invention, the photo sensing element OPD may be an organic photodiode which includes an organic material as a photoelectric conversion layer. The anode of the photo sensing element OPD may be connected with the first sensing node SN1, and the cathode of the photo sensing element OPD may be connected with the second driving voltage line VL2 which transfers the second driving voltage ELVSS.

The sensor driving circuit SDC may include three transistors ST1-ST3. The three transistors ST1-ST3 may be the reset transistor ST1, the amplification transistor ST2, and the output transistor ST3. At least one of the reset transistor ST1, the amplification transistor ST2, and the output transistor ST3 may be an oxide semiconductor. As an example of the present invention, the reset transistor ST1 may be an oxide semiconductor transistor, and the amplification transistor ST2 and the output transistor ST3 may be LTPS transistors. However, the present invention is not limited thereto. In an embodiment, the reset transistor ST1 and the output transistor ST3 may at least be oxide semiconductors, and the amplification transistor ST2 may be an oxide semiconductor transistor or an LTPS transistor.

Some of the reset transistor ST1, the amplification transistor ST2, and the output transistor ST3 may be P-type transistors, and the others may be N-type transistors. As an example of the present invention, the amplification transistor ST2 and the output transistor ST3 may be PMOS transistors, and the reset transistor ST1 may be the NMOS transistor. However, the present is not limited thereto. In some embodiments, all the reset transistor ST1, the amplification transistor ST2, and the output transistor ST3 may be N-type transistors or P-type transistors.

Some (e.g., the reset transistor ST1) of the reset transistor ST1, the amplification transistor ST2, and the output transistor ST3 may be transistors of the same type as the third and fourth transistors T3 and T4 of the pixel PXij. The amplification transistor ST2 and the output transistor ST3 may be transistors of the same type as the first, second, fifth, sixth, and seventh transistors T1, T2, T5, T6, and T7 of the pixel PXij.

A circuit configuration of the sensor driving circuit SDC according to the present invention is not limited to FIG. 5. The sensor driving circuit SDC illustrated in FIG. 5 is only an example, and the configuration of the sensor driving circuit SDC may be modified and implemented.

The reset transistor ST1 may include a first electrode for receiving a reset signal RST, a second electrode connected with a first sensing node SN1, and a third electrode for receiving a reset control signal. The reset transistor ST1 may reset a potential of the first sensing node SN1 to the reset signal RST in response to the reset control signal. The reset control signal may be the jth compensation scan line SCj provided through the jth compensation scan line SCLj. In other words, the reset transistor ST1 may receive the jth compensation scan signal SCj, provided from the jth compensation scan line SCLj, as the reset control signal. As an example of the present invention, the reset signal RST may at least be a signal having a voltage level lower than the second driving voltage ELVSS, during the activation interval of the jth compensation scan signal SCj.

The reset transistor ST1 may include a plurality of sub-reset transistors connected with each other in series. For example, the reset transistor ST1 may include two sub-reset transistors (hereinafter, referred to as first and second sub-reset transistors). A third electrode of the first sub-reset transistor and a third electrode of the second sub-reset transistor may be connected with the jth compensation scan line SCLj. A second electrode of the first sub-reset transistor and a first electrode of the second sub-reset transistor may be electrically connected with each other. The reset signal RST may be applied to the first electrode of the first sub-reset transistor, and the second electrode of the second sub-reset transistor may be electrically connected with the first sensing node SN1. However, the number of sub-reset transistors is not limited thereto. In an embodiment, the number of sub-reset transistors may be variously modified.

The amplification transistor ST2 may include a first electrode for receiving a sensing driving voltage SLVD, a second electrode connected with a second sensing node SN2, and a third electrode connected with the first sensing node SN1. The amplification transistor ST2 may be turned on according to the potential of the first sensing node SN1 to apply a sensing driving voltage SLVD to the second sensing node SN2. As an example of the present invention, the sensing driving voltage SLVD may be one of the first driving voltage ELVDD, the first initialization voltage VINT1, and the second initialization voltage VINT2. When the sensing driving voltage SLVD is the first driving voltage ELVDD, the first electrode of the amplification transistor ST2 may be electronically connected with the first driving voltage line VL1. When the sensing driving voltage SLVD is the first initialization voltage VINT1, the first electrode of the amplification transistor ST2 may be electrically connected with the first initialization voltage line VL3. When the sensing driving voltage SLVD is the second initialization voltage VINT2, the first electrode of the amplification transistor ST2 may be electrically connected with a second initialization voltage line VL4.

The output transistor ST3 may include a first electrode connected with the second sensing node SN2, a second electrode connected with the readout line RL, and a third electrode for receiving an output control signal. The output transistor ST3 may deliver a sensing signal FSj to the readout line RL in response to the output control signal. The output control signal may be a j+1st write scan signal SWj+1 provided through the j+1st write scan line SWLj+1. In other words, the output transistor ST3 may receive a j+1st write scan signal SWj+1 as the output control signal from the j+1st write scan line SWLj+1.

Figure 6:
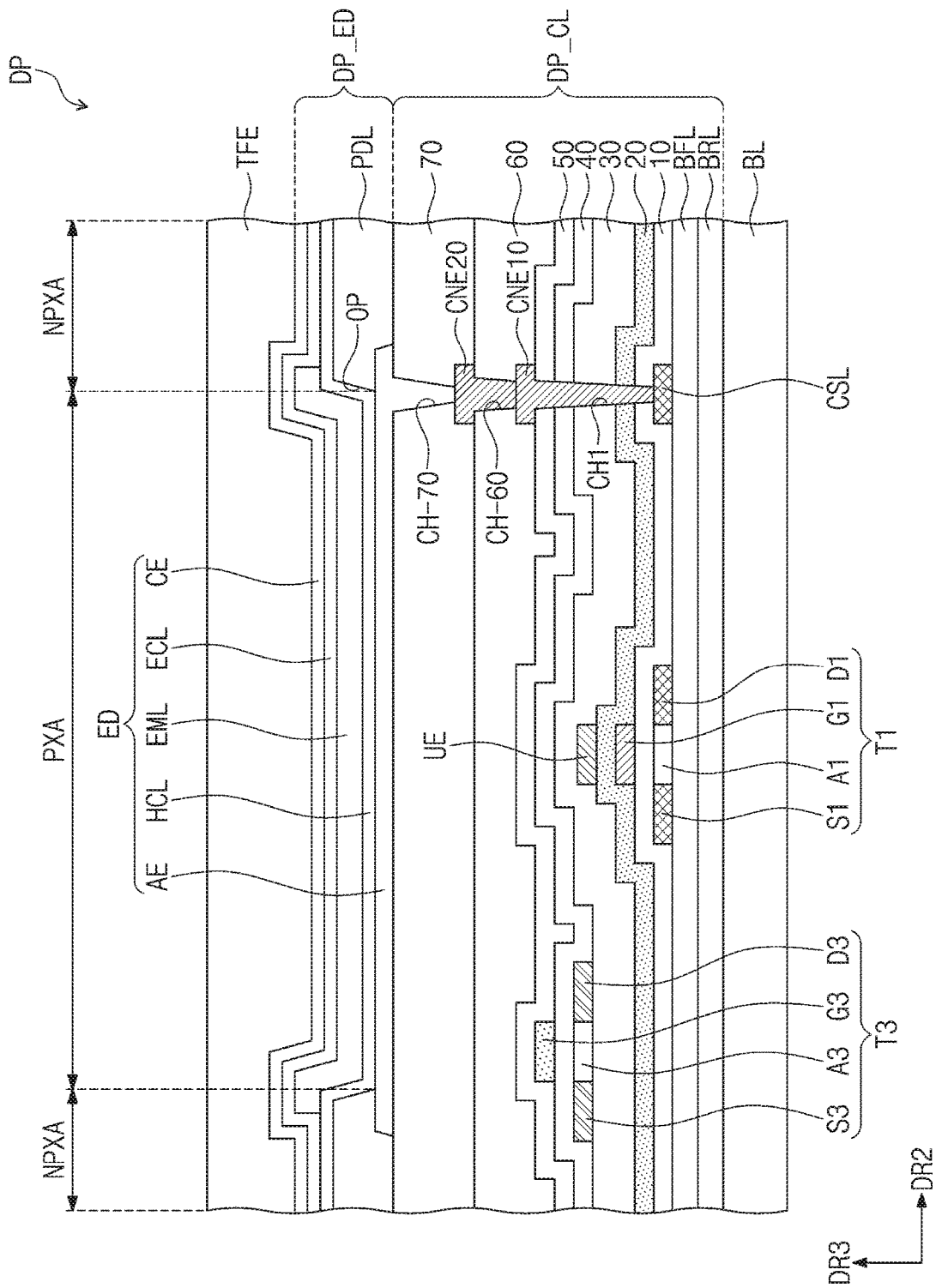
FIG. 6 is a cross-sectional view illustrating a pixel of a display panel according to an embodiment of the present disclosure.
Figure 7B:
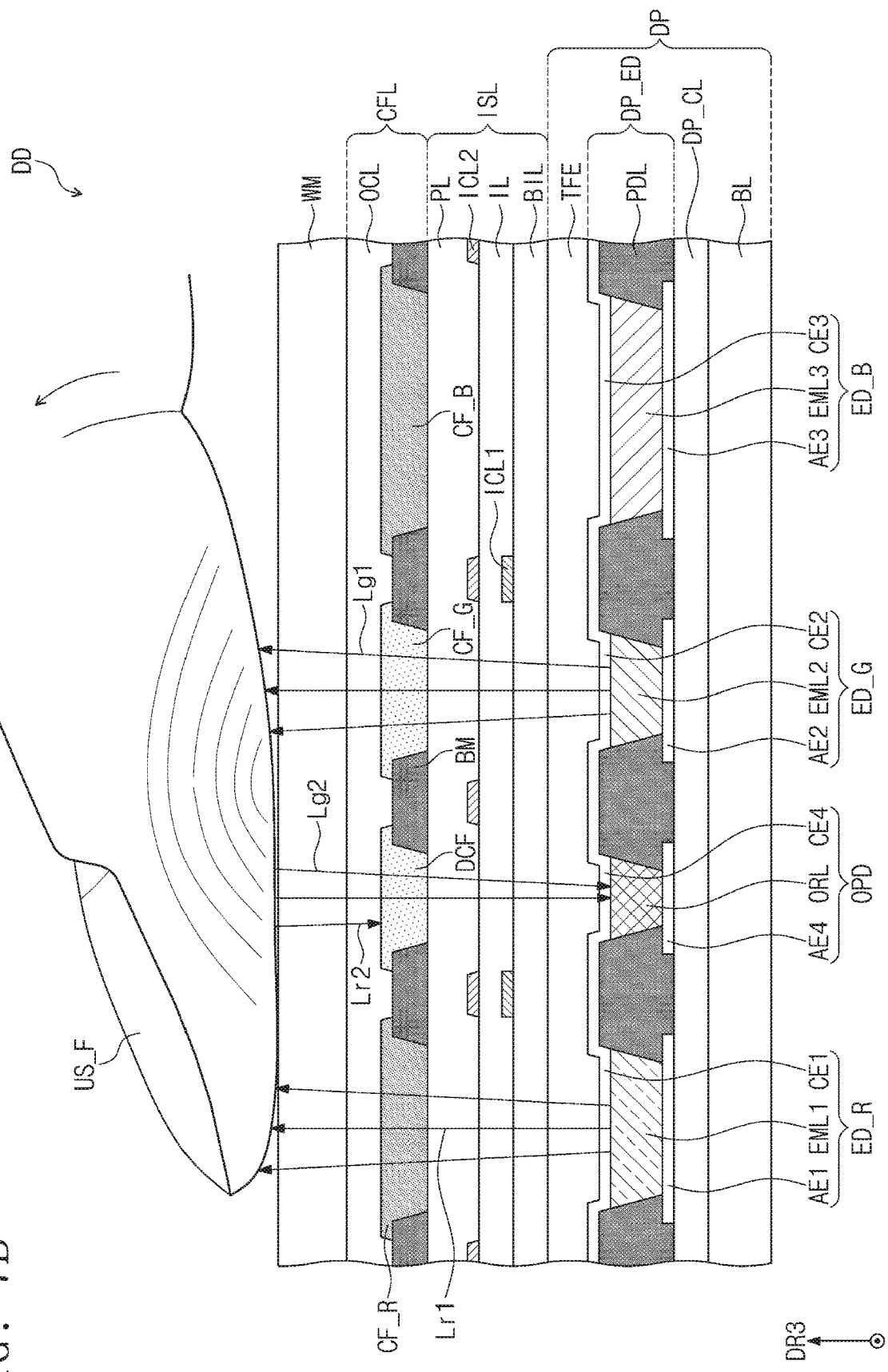

FIG. 6 is a cross-sectional view illustrating a pixel of a display panel according to an embodiment of the present disclosure. FIGS. 7A and 7B are cross-sectional views illustrating a light emitting element and a photo sensing element of a display panel according to an embodiment of the present disclosure.

Referring to FIGS. 6 and 7A, a display panel DP may include a base layer BL, a circuit layer DP_CL disposed on the base layer BL, a device layer DP_ED, and an encapsulation layer TFE.

The base layer BL may be a member which provides a base surface on which the circuit layer DP_CL is disposed. The base layer BL may be a rigid substrate or may be a flexible substrate capable of being bent, folded, rolled, or the like. The base layer BL may be a glass substrate, a metal substrate, a polymer substrate, or the like. However, the present invention is not limited thereto. In an embodiment, the base layer BL may be an inorganic layer, an organic layer, or a composite material layer.

The base layer BL may have a multi-layered structure. For example, the base layer BL may include or may be a first synthetic resin layer, an intermediate layer of a multi- or single-layered structure, and a second synthetic resin layer disposed on the intermediate layer. The intermediate layer may be referred to as a base barrier layer. The intermediate layer may include or may be, but is particularly limited to, a silicon oxide (SiOx) layer and an amorphous silicon (a-Si) layer disposed on the silicon oxide (SiOx) layer. For example, the intermediate layer may include or may be formed of at least one of a silicon oxide layer, a silicon nitride layer, a silicon oxynitride layer, and an amorphous silicon layer.

Each of the first and second synthetic resin layers may include or may be formed of a polyimide-based resin. In an embodiment, each of the first and second synthetic resin layers may include or may be formed of at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Meanwhile, the "X"-based resin in the specification refers to including a functional group of "X". At least one inorganic layer may be formed on the upper surface of the base layer BL. The inorganic layer may include or may be formed of at least one of aluminum oxide, titanium oxide, silicon oxide, silicon oxynitride, zirconium oxide, and hafnium oxide. The inorganic layer may be formed of multiple layers. The inorganic layers of the multiple layers may form a barrier layer BRL and/or a buffer layer BFL. The barrier layer BRL and the buffer layer BFL may be selectively arranged.

The barrier layer BRL may prevent foreign substances from being introduced from the outside. The barrier layer BRL may include or may be formed of a silicon oxide layer and a silicon nitride layer. Each of the silicon oxide layer and the silicon nitride layer may be provided in plural. The silicon oxide layers and the silicon nitride layers may be alternately laminated.

The buffer layer BFL may be disposed on the barrier layer BRL. The buffer layer BFL may improve a bonding force between the base layer BL and a semiconductor pattern and/or a conductive pattern. The buffer layer BFL may include or may be formed of a silicon oxide layer and a silicon nitride layer. The silicon oxide layer and the silicon nitride layer may be alternately laminated.

The semiconductor pattern may be disposed on the buffer layer BFL. Hereinafter, the semiconductor pattern directly disposed on the buffer layer BFL is defined as a first semiconductor pattern. The first semiconductor pattern may include or may be formed of a silicon semiconductor. The first semiconductor pattern may include or may be formed of polysilicon. However, the present invention is not limited thereto. In an embodiment, the first semiconductor pattern may include or may be formed of amorphous silicon.

FIG. 6 only illustrates a portion of the first semiconductor pattern disposed on the buffer layer BFL. The first semiconductor pattern may be further disposed on another region of a pixel PXij (refer to FIG. 5). The first semiconductor pattern may be arranged in a regular rule across pixels. An electrical property of the semiconductor pattern may vary with whether it is doped. The first semiconductor pattern may include a first area having high conductivity and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped with a concentration lower than the first area.

A conductivity of the first area is greater than a conductivity of the second area. The first area may substantially serve as an electrode or a signal line. The second area may substantially correspond to an active area (or channel) of the transistor. In other words, a portion of the semiconductor pattern may be an active area of the transistor, another portion thereof may be a source or a drain of the transistor, and the other may be a connection electrode or a connection signal line.

As shown in FIG. 6, a first electrode S1, a channel part S1, and a second electrode D1 of a first transistor T1 may be formed from the first semiconductor pattern. The first electrode S1 and the second electrode D1 of the first transistor T1 may be extended in an opposite direction from the channel part A1.

FIG. 6 illustrates a portion of a connection signal line CSL formed from the semiconductor pattern. Although not shown separately, the connection signal line CSL may be connected with a second electrode of a sixth transistor T6 (refer to FIG. 5) on a plane.

A first insulating layer 10 may be disposed on the buffer layer BFL. The first insulating layer 10 may overlap a plurality of pixels in common and may cover the semiconductor pattern. The first insulating layer 10 may be an inorganic layer and/or an organic layer and may have a single- or multi-layered structure. The first insulating layer 10 may include or may be formed of at least one of aluminum oxide, titanium oxide, silicon oxide, silicon nitride, silicon oxynitride, zirconium oxide, and hafnium oxide. In an embodiment, the first insulating layer 10 may be a single silicon oxide layer. As well as the first insulating layer 10, an insulating layer of the circuit layer DP_CL to be described below may be an inorganic layer and/or an organic layer and may have a single- or multi-layered structure. The inorganic layer may include or may be formed of, but is not limited to, at least one of the materials described above.

A third electrode G1 of the first transistor T1 may be disposed on the first insulating layer 10. The third electrode G1 may be a portion of the first conductive pattern. The third electrode G1 of the first transistor T1 may overlap the channel part A1 of the first transistor T1. The third electrode G1 of the first transistor T1 may function as a mask in the process of doping the first semiconductor pattern.

A second insulating layer 20 may be disposed on the first insulating layer 10 and may cover the third electrode G1 of the first transistor T1. The second insulating layer 20 may be an inorganic layer and/or an organic layer and may have a single- or multi-layered structure. The second insulating layer 20 may include or may be formed of at least one of silicon oxide, silicon nitride, and silicon oxynitride. In an embodiment, the second insulating layer 20 may have a multi-layered structure including a silicon oxide layer and a silicon nitride layer.

A third insulating layer 30 may be disposed on the second insulating layer 20. The third insulating layer 30 may have a single- or multi-layered structure. For example, the third insulating layer 30 may have a multi-layered structure including a silicon oxide layer and a silicon nitride layer. An upper electrode UE of a storage capacitor Cst may be disposed between the second insulating layer 20 and the third insulating layer 30. A lower electrode of the storage capacitor Cst may be disposed between the first insulating layer 10 and the second insulating layer 20.

In an embodiment of the present invention, the second insulating layer 20 may be replaced with an insulating pattern. The upper electrode UE may be disposed on the insulating pattern. The upper electrode UE may serve as a mask which forms the insulating pattern from the second insulating layer 20.

A second semiconductor pattern may be disposed on the third insulating layer 30. The second semiconductor pattern may include or may be formed of an oxide semiconductor. The oxide semiconductor may include a plurality of areas divided according to whether the metallic oxide is reduced. An area where the metallic oxide is reduced (hereinafter, referred to as a "reduction area") is larger in conductivity than an area where the metallic oxide is not reduced (hereinafter, referred to as a "non-reduction area"). The reduction area substantially has the role of a source/drain of the transistor or a signal line. The non-reduction area substantially correspond to an active area (or a semiconductor area or a channel part) of the transistor. In other words, a portion of the second semiconductor pattern may be an active area of the transistor, and another portion may a source/drawing area of the transistor, and the other may be a signal transmission area.

As shown in FIG. 6, a first electrode S3, a channel part A3, and a second electrode D3 of a third transistor T3 may be formed from the second semiconductor pattern. The first electrode S3 and the second electrode D3 may include or may be formed of metal reduced from a metal oxide semiconductor. The first electrode S3 and the second electrode D3 may have a certain thickness from an upper surface of the second semiconductor pattern and may include or may be formed of a metal layer including the reduced metal.

A fourth insulating layer 40 may be disposed on the third insulating layer 30. The fourth insulating layer 40 may overlap a plurality of pixels in common and may cover the second semiconductor pattern. The fourth insulating layer 40 may include or may be formed of at least one of aluminum oxide, titanium oxide, silicon oxide, silicon nitride, silicon oxynitride, zirconium oxide, and hafnium oxide.

A third electrode G3 of the third transistor T3 may be disposed on the fourth insulating layer 40. The third electrode G3 may be a portion of the third conductive pattern. The third electrode G3 of the third transistor T3 may overlap the channel part A3 of the third transistor T3. The third electrode G3 of the third transistor T3 may function as a mask in the process of doping the second semiconductor pattern.

In an embodiment of the present disclosure, the fourth insulating layer 40 may be replaced with an insulating pattern. The third electrode G3 of the third transistor T3 may be disposed on the insulating pattern. In an embodiment, the third electrode G3 may have the same shape on the plane as the insulating pattern. One third electrode G is illustrated for convenience of description in an embodiment, but the third transistor T3 may include two third electrodes.

A fifth insulating layer 50 may be disposed on the fourth insulating layer 40 and may cover the third electrode G3 of the third transistor T3. The fifth insulating layer 50 may be an inorganic layer and/or an organic layer and may have a single- or multi-layered structure. For example, the fifth insulating layer 50 may include or may be formed of a silicon oxide layer and a silicon nitride layer. The fifth insulating layer 50 may include or may be formed of a plurality of silicon oxide layers and silicon nitride layers, which are alternately laminated.

Although not shown separately, a first electrode and a second electrode of a fourth transistor T4 (refer to FIG. 5) may be formed through the same process as the first electrode S3 and the second electrode D3 of the third transistor T3. First and second electrodes of a reset transistor ST1 (refer to FIG. 5) of a sensor FXij (refer to FIG. 5) and first and second electrodes of an output transistor ST3 (refer to FIG. 5) may be formed at the same time through the same process as the first electrode S3 and the second electrode D3 of the third transistor T3.

A first connection electrode CNE10 may be disposed on the fifth insulating layer 50. The first connection electrode CNE10 may be connected with the connection signal line CSL through a contact hole CH1 penetrating the first to fifth insulating layers 10, 20, 30, 40, and 50.

A sixth insulating layer 60 may be disposed on the fifth insulating layer 50. A second connection electrode CNE20 may be disposed on the sixth insulating layer 60. The second connection electrode CNE20 may be connected with the first connection electrode CNE10 through a contact hole CH-60 penetrating the sixth insulating layer 60. A seventh insulating layer 70 may be disposed on the sixth insulating layer 60 and may cover the second connection electrode CNE20.

Each of the sixth insulating layer 60 and the seventh insulating layer 70 may be an organic layer. For example, each of the sixth insulating layer 60 and the seventh layer 70 may include or may be formed of a polymer, such as Benzocyclobutene (BCB), polyimide, hexamethyldisiloxane (HMDSO), polymethylmethacrylate (PMMA), or polystyrene (PS), a polymer derivative with a phenol-based group, an acrylic-based polymer, an imide-based polymer, an aryl ether-based polymer, an amide-based polymer, a fluorine-based polymer, a p-xylene-based polymer, a vinyl alcohol-based polymer, a blend thereof, and the like.

The device layer DP_ED may include a light emitting element ED and a pixel definition layer PDL. The light emitting element ED may include an anode AE, a hole control layer HCL, a light emitting layer EML, an electronic control layer ECL, and a cathode CE.

The anode AE may be disposed on the seventh insulating layer 70. The anode AE may be connected with the second connection electrode CNE20 through a contact hole CH-70 penetrating the seventh insulating layer 70. The anode AE may be a (semi) transmissive electrode or a reflective electrode. As an example, the anode AE may have a reflective layer formed of Ag, Mg, Al, Pt, Pd, Au, Ni, Nd, Ir, Cr, a compound thereof, or the like and a transparent or translucent electrode layer formed on the reflective layer. The transparent or translucent electrode layer may have indium tin oxide (ITO), indium zinc oxide (IZO), an indium gallium zinc oxide (IGZO), zinc oxide (ZnO), or indium oxide ($In_2O_3$), and at least one or more selected from a group including zinc oxide (AZO) doped with aluminum. For example, the anode AE may be provided as ITO/Ag/ITO.

The pixel definition layer PDL may be disposed on the seventh insulating layer 70. In an embodiment, the pixel definition layer PDL may have the property of absorbing light. For example, the pixel definition layer PDL may have a black color. The pixel definition layer PDL may include a black coloring agent. The black coloring agent may include black dye or black pigment. The black coloring agent may include carbon black, aniline black, metal such as chromium, or metal oxide. The pixel definition layer PDL may be formed by mixing a blue organic material and a black organic material. The pixel definition layer PDL may further include a lyophobic organic matter.

An opening OP of the pixel definition layer PDL may expose at least a part of the light emitting element ED. The opening OP of the pixel definition layer PDL may define a light emitting area PXA. For example, a plurality of pixels PX (refer to FIG. 3) may be arranged in a certain rule on a plane of a display panel DP (refer to FIG. 3). An area where the plurality of pixels PX are arranged may be defined as a pixel area. One pixel area may include a light emitting area PXA and a non-light emitting area NPXA adjacent to the light emitting area PXA. The non-light emitting area NPXA may surround the light emitting area PXA.

The hole control layer HCL may be disposed in common in the light emitting area PXA and the non-light emitting area NPXA. A common layer such as the hole control layer HCL may be formed in common in the plurality of pixels PX. The hole control layer HCL may include a hole transport layer and a hole injection layer.

A light emitting layer EML may be disposed on the hole control layer HCL. The light emitting layer EML may be disposed on only an area corresponding to the opening OP. The light emitting layer EML may be separately formed in each of the plurality of pixels PX.

The patterned light emitting layer EML is illustrated as an example in an embodiment, but the light emitting layer EML may be disposed in common in the plurality of pixels PX. The light emitting layer EML may generate a white light or a blue light. In an embodiment, the light emitting layer EML may have a multi-layered structure.

The electronic control layer ECL may be disposed on the light emitting layer EML. The electronic control layer ECL may include an electronic transport layer and an electronic injection layer. The cathode CE of the light emitting element ED may be disposed on the electronic control layer ECL. The electronic control layer ECL and the cathode CE may be arranged in common in the plurality of pixels PX.

An encapsulation layer TFE may be disposed on the cathode CE. The encapsulation layer TFE may cover the plurality of pixels PX. In an embodiment, the encapsulation layer TFE may directly cover the cathode CE. In an embodiment of the present disclosure, the display panel DP may further include a capping layer which directly covers the cathode CE. In an embodiment of the present disclosure, the laminated structure of the light emitting element ED may have a structure inverted from the structure shown in FIG. 6.

Referring to FIGS. 7A and 7B, a first electrode layer may be disposed on the device layer DP_ED. The pixel definition layer PDL may be formed on the first electrode layer. The first electrode layer may include first to third anodes AE1, AE2, and AE3. First to third openings OP1, OP2, and OP3 of the pixel definition layer PDL may expose at least some of the first to third anodes AE1, AE2, and AE3, respectively. As shown in FIG. 7A, the display panel DP may include first to third light emitting areas PXA-R, PXA-G, and PXA-B and first to third non-light emitting areas NPXA-R, NPXA-G, and NPXA-B adjacent to the first to third light emitting areas PXA-R, PXA-G, and PXA-B. Each of the non-light emitting areas NPXA-R, NPXA-G, and NPXA-B may surround the corresponding light emitting area PXA-R, PXA-G, or PXA-B. In an embodiment, the first light emitting area PXA_R may be defined to correspond to a partial area of the first anode AE1, which is exposed by the first opening OP1. The second light emitting area PXA_G may be defined to correspond to a partial area of the second anode AE2, which is exposed by the second opening OP2. The third light emitting area PXA_B may be defined to correspond to a partial area of the third anode AE3, which is exposed by the third opening OP3. A non-pixel area NPA may be defined between the first to third non-light emitting areas NPXA-R, NPXA-G, and NPXA-B.

A light emitting layer may be disposed on the first electrode layer. The light emitting layer may include first to third light emitting layers EML1, EML2, and EML3. The first to third light emitting layers EML1, EML2, and EML3 may be arranged in areas respectively correspond to the first to third openings OP1, OP2, and OP3. The first to third light emitting layers EML1, EML2, and EML3 may be respectively and separately formed in first to third pixels PX-R, PX-G, and PX-B (refer to FIG. 4A). Each of the first to third light emitting layers EML1-EML3 may include or may be formed of an organic material and/or an inorganic material. Each of the first to third light emitting layers EML1-EML3 may generate a certain colored light. For example, the first light emitting layer EML1 may generate a red light, the second light emitting layer EML2 may generate a green light, and the third light emitting layer EML3 may generate a blue light.

The patterned first to third light emitting layers EML1-EML3 are illustrated as an example in an embodiment, but one light emitting layer may be disposed in common in the first to third light emitting areas PXA-R, PXA-G, and PXA-B. At this time, the light emitting layer may generate a white light or a blue light. In an embodiment, the light emitting layer may have a multi-layered structure referred to as tandem.

Each of the first to third light emitting layers EML1-EML3 may include or may be formed of a low molecular weight organic matter or a high molecular weight organic matter as a light emitting material. In an embodiment, each of the first to third light emitting layers EML1-EML3 may include a quantum dot material as a light emitting material. The core of the quantum dot may be selected from a Group II-VI compound, a Group III-V compound, a Group IV-VI compound, a Group IV element, a Group IV compound, and a combination thereof.

A second electrode layer may be disposed on the light emitting layer. The second electrode layer may include first to third cathodes CE1, CE2, and CE3. The first to third cathodes CE1, CE2, and CE3 may be electrically connected with each other. As an example of the present invention, the first to third cathodes CE1, CE2, and CE3 may have a shape integrated with each other. The first to third cathodes CE1, CE2, and CE3 may be arranged in common in the first to third light emitting areas PXA-R, PXA-G, and PXA-B, the first to third non-light emitting areas NPXA-R, NPXA-G, and NPXA-B, and the non-pixel area NPA.

The device layer DP_ED may further include photo sensing elements OPD. Each of the photo sensing elements OPD may be a photodiode. The pixel definition layer PDL may further include a fourth opening OP4 provided to correspond to the photo sensing elements OPD.

Each of the photo sensing elements OPD may include a fourth anode AE4, a photoelectric conversion layer ORL, and a fourth cathode CE4. The fourth anode AE4 may be disposed on the same layer as the first electrode layer. In other words, the fourth anode AE4 may be disposed on the device layer DP_ED and may be formed at the same time through the same process as the first to third anodes AE1-AE3.

The fourth opening OP4 of the pixel defining layer PDL may expose at least a part of the fourth anode AE4. The photoelectric conversion layer ORL may be disposed on the fourth anode AE4 exposed by the fourth opening OP4. The photoelectric conversion layer ORL may include an organic photo sensing material. The fourth cathode CE4 may be disposed on the photoelectric conversion layer ORL. The fourth cathode CE4 may be formed at the same time through the same process as the first to third cathodes CE1-CE3. As an example of the present disclosure, the fourth cathode CE4 may have a shape integrated with the first to third cathodes CE1-CE3.

Each of the fourth anode AE4 and the fourth cathode CE4 may receive an electrical signal. The fourth cathode CE4 may receive a signal different from the fourth anode AE4. Thus, a certain electric field may be formed between the fourth anode AE4 and the fourth cathode CE4. The photoelectric conversion layer ORL may generate an electrical signal corresponding to light incident to the sensor. The photoelectric conversion layer ORL may absorb an energy of the incident light to generate charges. For example, the photoelectric conversion layer ORL may include a photosensitive semiconductor material.

The charges generated in the photoelectric conversion layer ORL may change an electric field between the fourth anode AE4 and the fourth cathode CE4. The amount of charges generated in the photoelectric conversion layer ORL may vary with whether light is incident to the photo sensing elements OPD, the amount of the light incident to the photo sensing elements OPD, and an intensity of the light incident to the photo sensing elements OPD. Thus, the electric field formed between the fourth anode AE4 and the fourth cathode CE4 may vary. The photo sensing elements OPD according to the present disclosure may obtain fingerprint information of a user by means of a change in electric field between the fourth anode AE4 and the fourth cathode CE4.

In an embodiment, each of the photo sensing elements OPD may include a photo-transistor which uses the photoelectric conversion layer ORL as an active layer. Each of the photo sensing elements OPD may detect the amount of flow flowing in the photo-transistor to obtain fingerprint information. Each of the photo sensing elements OPD according to an embodiment of the present disclosure may include various photoelectric conversion elements capable of generating an electrical signal in response to a change in the amount of light, and is not limited to any one embodiment.

An encapsulation layer TFE may be disposed on the device layer DP_ED. The encapsulation layer TFE may include or may be formed of at least one of an inorganic layer and an organic layer. In an embodiment of the present invention, the encapsulation layer TFE may include or may be formed of two inorganic layers and an organic layer disposed between the two inorganic layers. In an embodiment of the present disclosure, a thin film encapsulation layer may include or may be formed of a plurality of inorganic layers and a plurality of organic layers, which are alternately laminated.

The encapsulation inorganic layer may protect the first to third light emitting elements ED_R, ED_G, and ED_B and the photo sensing element OPD from moisture/oxygen and may protect. The encapsulation organic layer may protect the first to third light emitting elements ED_R, ED_G, and ED_B and the photo sensing element OPD from foreign substances such as dust particles. The encapsulation inorganic layer may include or may be, but is not particularly limited to, a silicon nitride layer, a silicon oxynitride layer, a silicon oxide layer, a titanium oxide layer, an aluminum oxide layer, or the like. The encapsulation organic layer may include or may be, but is not particularly limited to, an acrylic-based organic layer.

The display device DD may further include an input sensing layer ISL disposed on the display panel DP and an anti-reflection layer CFL disposed on the input sensing layer ISL.

The input sensing layer ISL may be directly disposed on the encapsulation layer TFE. The input sensing layer ISL may be referred to as a sensor layer, a sensor, or an input sensing panel. The input sensing layer ISL may include a base layer BIL, a first conductive layer ICL1, an insulating layer IL, a second conductive layer ICL2, and a protective layer PL.

The base layer BIL may be directly disposed on the display panel DP. The base layer BIL may be an inorganic layer including at least one of silicon nitride, silicon oxynitride, and silicon oxide. In an embodiment, the base layer BIL may be an organic layer including an epoxy resin, an acrylic resin, or an imide-based resin. The base layer BIL may have a single-layered structure or may a multi-layered structure laminated along the third direction DR3.

The first conductive layer ICL1 may be disposed on the base layer BIL. FIGS. 7A and 7B illustrates a structure where the first conductive layer ICL1 is directly disposed on the base layer BIL, but the present disclosure is not limited thereto. For example, the base layer BIL of the input sensing layer ISL may be omitted, and the first conductive layer ICL1 may be directly disposed on the encapsulation layer TFE. The insulating layer IL may cover the first conductive layer ICL1 and may be disposed on the base layer BIL. The second conductive layer ICL2 is disposed on the insulating layer IL. FIGS. 7A and 7B illustrate a structure where the input sensing layer ISL includes the first and second conductive layers ICL1 and ICL2, but the present disclosure is not limited thereto. For example, the input sensing layer ISL may include or may be formed of only one of the first and second conductive layers ICL1 and ICL2.

The protective layer PL may be disposed on the second conductive layer ICL2. The protective layer PL may include or may be formed of an organic insulating material. The protective layer PL may serve to protect the first and second conductive layers ICL1 and ICL2 from moisture/oxygen and protect the first and second conductive layers ICL1 and ICL2 from foreign substances.

The anti-reflection layer CFL may be disposed on the input sensing layer ISL. The anti-reflection layer CFL may be directly disposed on the protective layer PL. The anti-reflection layer CFL may include a first color filter CF_R, a second color filter CF_G, and a third color filter CF_B. The first color filter CF_R may have a first color, the second color filter CF_G may have a second color, and the third color filter CF_B may have a third color. As an example of the present disclosure, the first color may be a red color, the second color may be a green color, and the third color may be a blue color.

The anti-reflection layer CFL may further include a dummy color filter DCF. As an example of the present disclosure, when the area where the photoelectric conversion layer ORL is defined as a sensing area SA and when the periphery of the sensing area SA is defined as a non-sensing area NSA, the dummy color filter DCF may be disposed to correspond to the sensing area SA. The dummy color filter DCF may overlap the sensing area SA and the non-sensing area NSA. As an example of the present disclosure, the dummy color filter DCF may have the same color as one of the first to third color filters CF_R, CF_G, and CF_B. As an example of the present disclosure, the dummy color filter DCF may have the green color to be the same as the second color filter CF_G.

The anti-reflection layer CFL may further include a black matrix BM. The black matrix BM may be disposed to correspond to the non-pixel area NPA. The black matrix BM may overlap the first and second conductive layers ICL1 and ICL2 in the non-pixel area NPA. As an example of the present disclosure, the black matrix BM may overlap the non-pixel area NPA and the first to third non-light emitting areas NPXA-R, NPXA-G, and NPXA-B. The black matrix BM may not overlap the first to third light emitting areas PXA-R, PXR-G, and PXA-B.

The anti-reflection layer CFL may further include an over-coating layer OCL. The over-coating layer OCL may include or may be formed of an organic insulating material. The over-coating layer OCL may be provided at a thickness to such an extent as to remove a step difference between the first to third color filters CF_R, CF_G, and CF_B. The over-coating layer OCL may include or may be formed of, but is particularly limited to, any material capable of having a certain thickness and smoothing (i.e., planarizing) an upper surface of the anti-reflection layer CFL. For example, the over-coat layer OCL may include or may be formed of an acrylate-based organic matter.

Referring to FIG. 7B, when a display device DD (refer to FIG. 1) operates, each of the first to third light emitting elements ED_R, ED_G, and ED_B may output light. The first light emitting elements ED_R may output a first light, the second light emitting elements ED_G may output a second light, and the third light emitting elements ED_B may output a third light. Herein, the first light Lr1 may be light in a red wavelength band, the second light Lg1 may be light in a green wavelength band, and the third light may be light in a blue wavelength band.

As an example of the present disclosure, each of the photo sensing elements OPD may receive light from specific light emitting elements (e.g., the second light emitting elements ED_G) among the first to third light emitting elements ED_R, ED_G, and ED_B. In other words, each of the photo sensing elements OPD may receive a second reflected light Lg2 in which the second light Lg1 output from the second light emitting elements ED-G is reflected from a fingerprint of the user. Each of the second light Lg1 and the second reflected light Lg2 may be light in the green wavelength band. A dummy color filter DCF may be disposed on an upper portion of the photo sensing elements OPD. The dummy color filter DCF may have a green color. Thus, the second reflected light Lg2 may be incident to the photo sensing elements OPD through the dummy color filter DCF.

The second and third lights output from the second and third light emitting elements ED_G and ED_B may be reflected by a hand US_F of the user. For example, when light in which the first light Lr1 output from the first light emitting elements ED_R is reflected by the hand US_F of the user is defined as the first reflected light Lr2, the first reflected light Lr2 may be absorbed without passing through the dummy color filter DCF. Thus, the first reflected light Lr2 may not pass through the dummy color filter DCF not to be incident to the photo sensing elements OPD. Likewise, although the third light is reflected by the hand US_F of the user, it may be absorbed by the dummy color filter DCF. Thus, only the second reflected light Lg2 may be provided to the photo sensing elements OPD.

FIGS. 8A to 8G are plan views illustrating conductive patterns making up a pixel driving circuit and a sensor driving circuit of FIG. 5 for each layer.

Referring to FIGS. 8A to 8G, conductive patterns and semiconductor patterns may be repeatedly arranged in a certain rule on the plane. Plan views of some of pixel driving circuits and a part of a sensor driving circuit are illustrated in FIGS. 8A to 8G. A first portion PDC1p and a second portion PDC2p may have structures which are symmetrical to each other and may form pixel driving circuits. A third portion SDCp may form sensor driving circuits.

FIGS. 8A to 8G illustrate the first portion PDC1p and the second portion PDC2p, which have the structures which are symmetrical to each other. However, the same structure as the first portion PDC1p may be continuously repeated, or the same structure as the second portion PDC2p may be continuously repeated. For example, the first portion PDC1p, the second portion PDC2p, and the third portion SDCp as shown in FIGS. 8A to 8G may be repeatedly arranged along a first direction DR1 and a second direction DR2. However, the present disclosure is not particularly limited thereto.

Figure 8A:
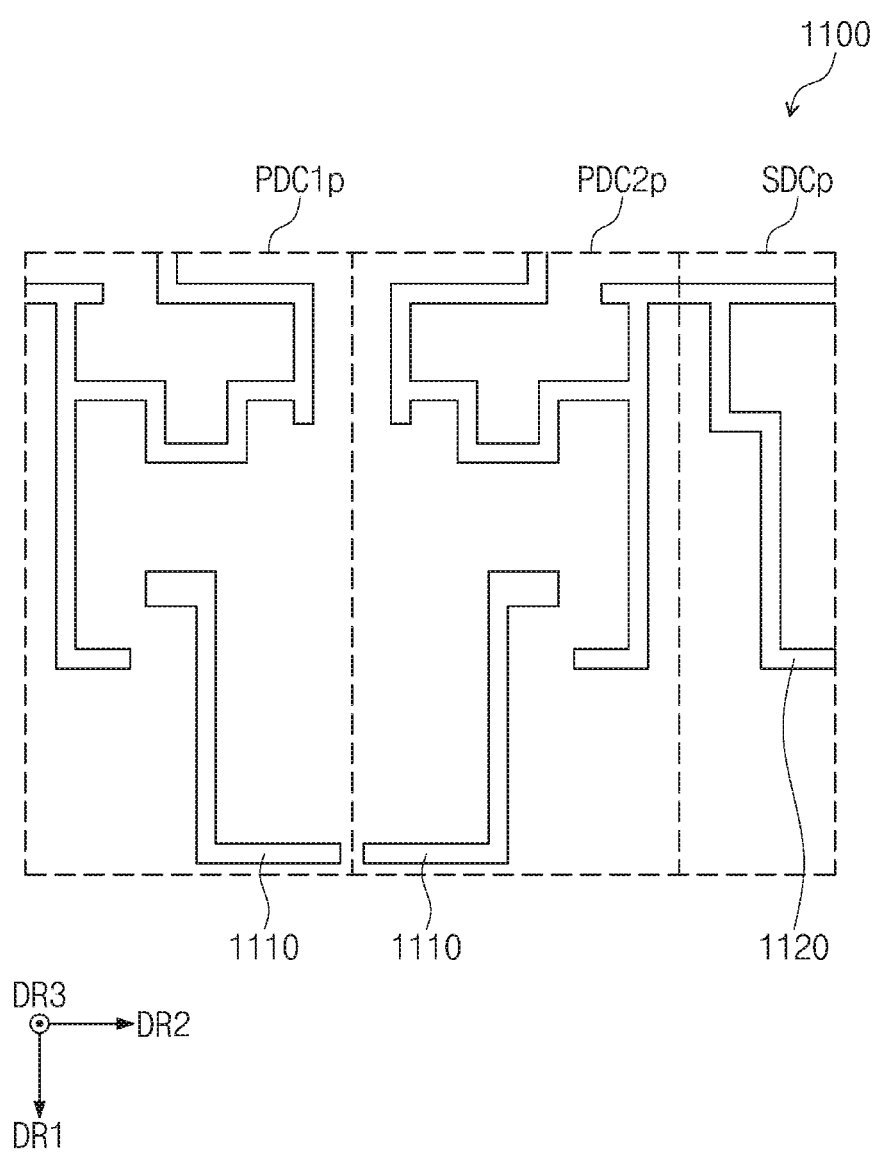
FIGS. 8A, 8B, 8C, 8D, 8E, 8F, and 8G are plan views illustrating conductive patterns making up a pixel driving circuit and a sensor driving circuit of FIG. 5 for each layer.

Referring to FIGS. 6 and 8A, a first semiconductor pattern 1100 is illustrated. The first semiconductor pattern 1100 may be disposed between a buffer layer BFL and a first insulating layer 10. The first semiconductor pattern 1100 may include or may be formed of a silicon semiconductor. For example, the silicon semiconductor may include amorphous silicon, polycrystalline silicon, or the like. For example, the first semiconductor pattern 1100 may include or may be formed of low temperature polysilicon (LTPS).

The first semiconductor pattern 1100 may be divided into a first semiconductor portion 1110 included in the first and second portions PDC1p and PDC2p and a second semiconductor portion 1120 included in the third portion SDCp.

Figure 8B:
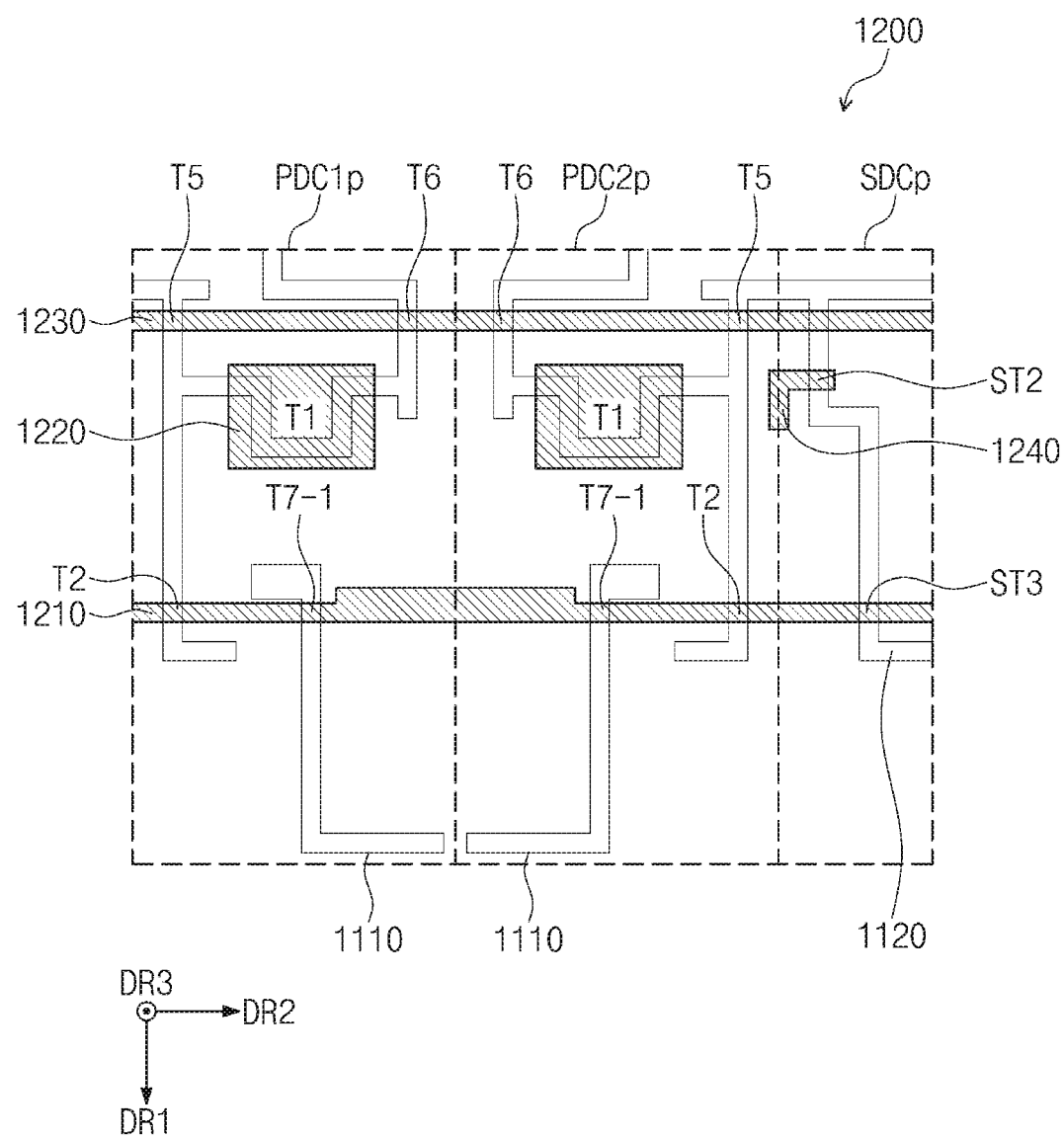

Referring to FIGS. 6 and 8B, a first conductive pattern 1200 may be disposed on the first insulating layer 10. The first conductive pattern 1200 may include or may be formed of metal, an alloy, a conductive metal oxide, a transparent conductive material, or the like. For example, the first conductive pattern 1200 may include or may be formed of, but is not particularly limited to, silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), or the like.

The first conductive pattern 1200 may include a first gate line 1210, a gate electrode 1220, and a second gate line 1230.

The first gate line 1210 may be extended in a second direction DR2. The first gate line 1210 may correspond to a jth write scan line SWLj of FIG. 5. The first gate line 1210 may form a second transistor T2 together with the first semiconductor portion 1110. For example, the jth write scan signal SWj (refer to FIG. 5) may be provided to the first gate line 1210. The first gate line 1210 may form a seventh transistor T7-1 together with the first semiconductor portion 1110. For example, when a second transistor T2 shown in FIG. 8B is included in a jth column of pixel driving circuit, the seventh transistor T7-1 shown in FIG. 8B may be included in a j-1th column of pixel driving circuit. Thus, the first gate line 1210 may form an output transistor ST3 together with the second semiconductor portion 1120.

The output transistor ST3 may be included in a j-1th column of sensor driving circuit.

The first gate electrode 1220 may be disposed in the shape of an island. The first gate electrode 1220 may form a first transistor T1 together with the first semiconductor pattern 1100. The gate electrode 1220 may correspond to a third electrode G1 of the first transistor T1 shown in FIG. 6.

The second gate line 1230 may be extended in the second direction DR2. The second gate line 1230 may correspond to a jth light emitting control line EMLj of FIG. 5. The second gate line 1230 may form fifth and sixth transistors T5 and T6 together with the first semiconductor pattern 1100. For example, the jth light emitting control signal EMj may be provided to the second gate line 1230.

The second gate electrode 1240 may be disposed in the shape of an island. The second gate electrode 1240 may form an amplification transistor ST2 together with the first semiconductor pattern 1100.

Figure 8C:
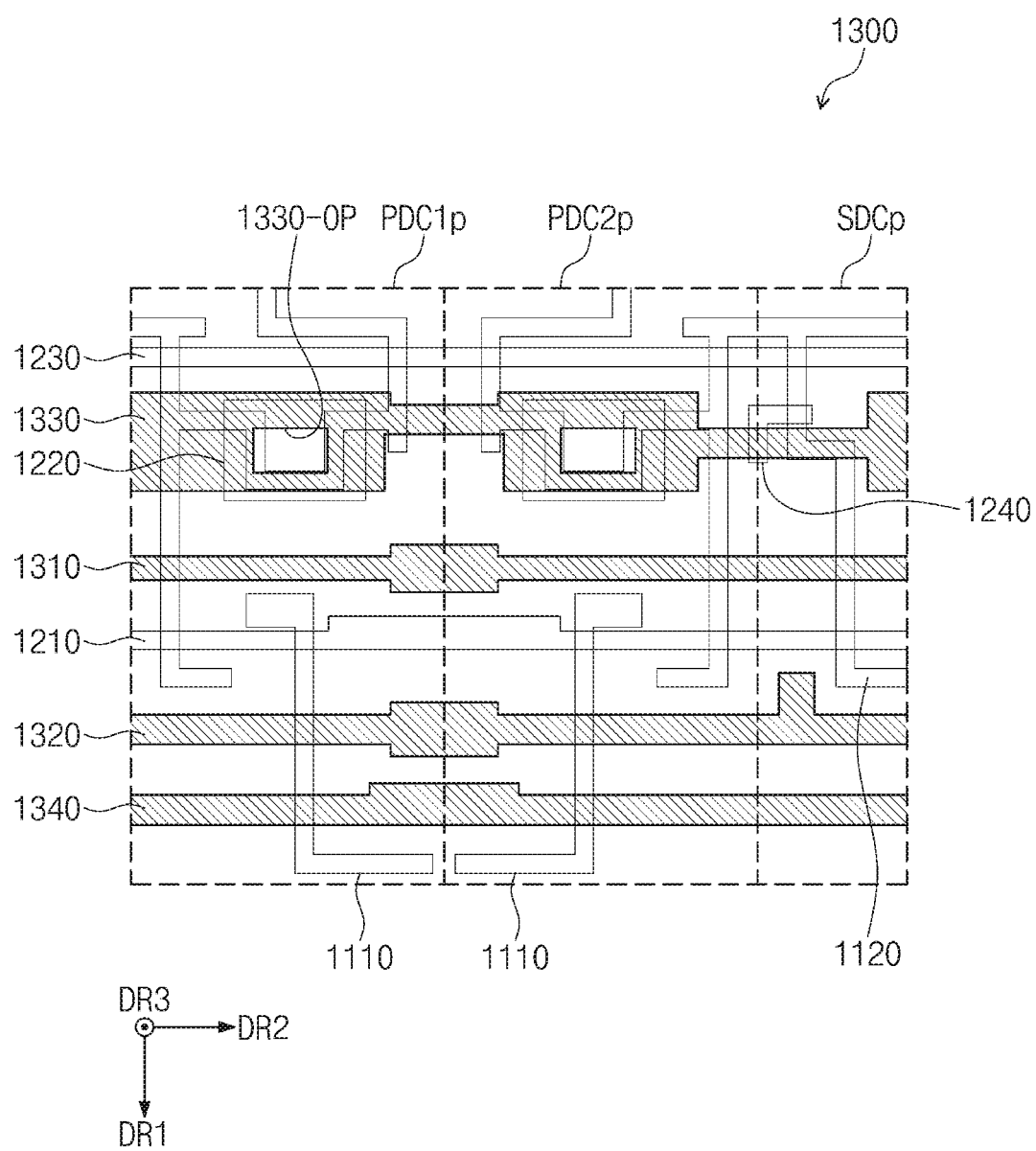

Referring to FIGS. 6 and 8C, a second insulating layer 20 may cover the first conductive pattern 1200 and may be disposed on the first insulating layer 10. A second conductive pattern 1300 may be disposed on the second insulating layer 20. The second conductive pattern 1300 may include or may be formed of metal, an alloy, a conductive metal oxide, a transparent conductive material, or the like.

The second conductive pattern 1300 may include a third gate line 1310, a fourth gate line 1320, a storage capacitor electrode 1330, and a first initialization voltage wire 1340.

The third gate line 1310 may be extended in the second direction DR2. The third gate line 1310 may correspond to a jth compensation scan line SCLj (refer to FIG. 5). The fourth gate line 1320 may be extended in the second direction DR2. The fourth gate line 1320 may correspond to a jth initialization scan line SILj (refer to FIG. 4). The storage capacitor electrode 1330 may overlap the first gate electrode 1220 and may be extended in the second direction DR2. For example, the storage capacitor electrode 1330 may form a storage capacitor Cst (refer to FIG. 5) together with the first gate electrode 1220. The storage capacitor electrode 1330 may correspond to an upper electrode UE. A driving voltage ELVDD (refer to FIG. 5) may be provided to the storage capacitor electrode 1330. An opening 1330-OP penetrating the storage capacitor electrode 1330 may be formed in the storage capacitor electrode 1330, and the first gate electrode 1220 may be exposed through the opening 1330-OP.

The first initialization voltage wire 1340 may be extended in the second direction DR2. The first initialization voltage wire 1340 may correspond to a first initialization voltage line VL3. A first initialization voltage VINT1 (refer to FIG. 4) may be provided through the first initialization voltage wire 1340.

Figure 8D:
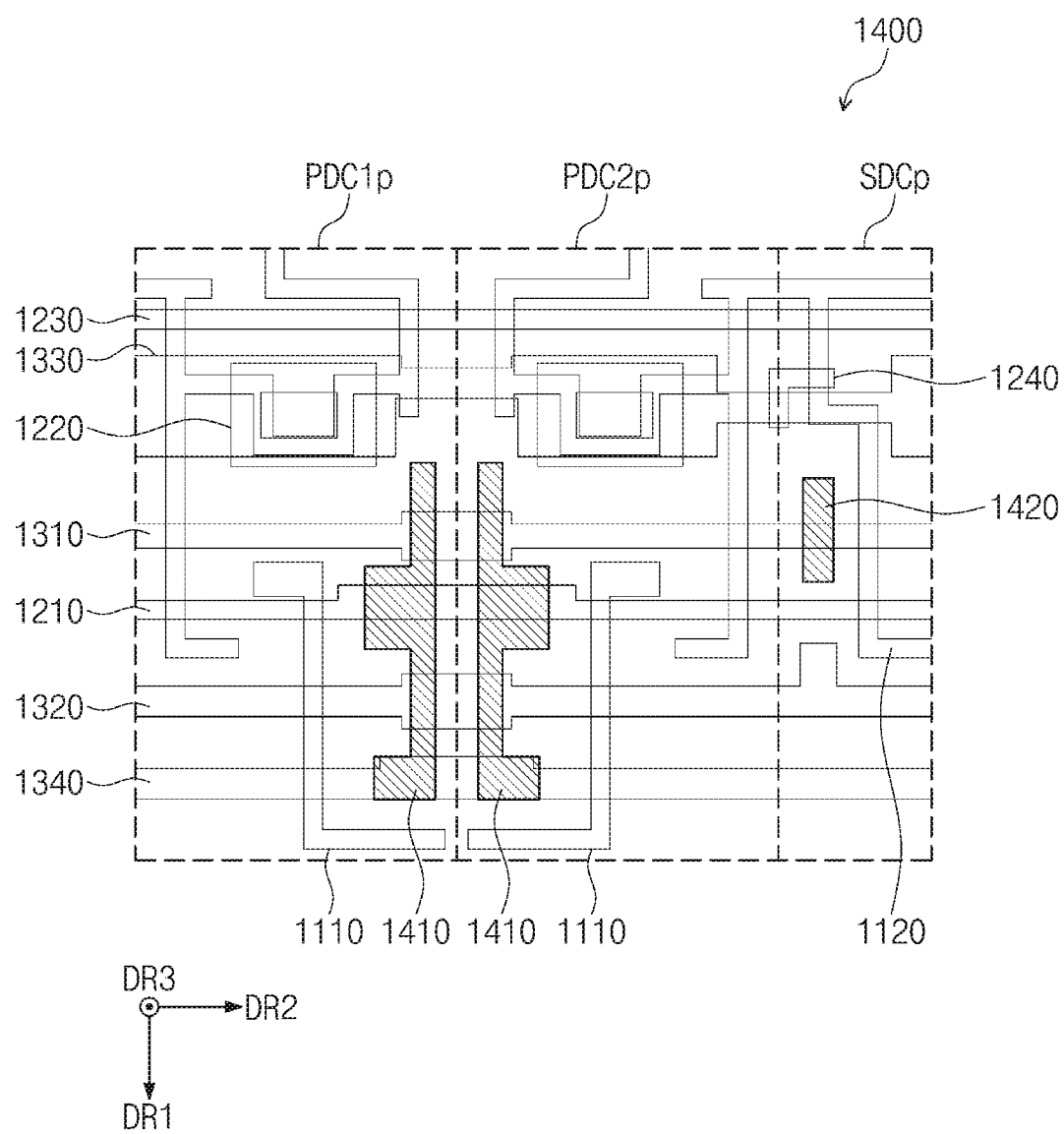

Referring to FIGS. 6 and 8D, a third insulating layer 30 may cover the second conductive pattern 1300 and may be disposed on the second insulating layer 20. A second semiconductor pattern 1400 may be disposed on the third insulating layer 30. The second semiconductor pattern 1400 may include or may be formed of an oxide semiconductor. The second semiconductor pattern 1400 may be disposed on a layer different from the first semiconductor pattern 110 and may not overlap the first semiconductor pattern 1100.

The second semiconductor pattern 1400 may be divided into a third semiconductor portion 1410 included in the first and second portions PDC1p and PDC2p and a fourth semiconductor portion 1420 included in the third portion SDCp.

Figure 8E:
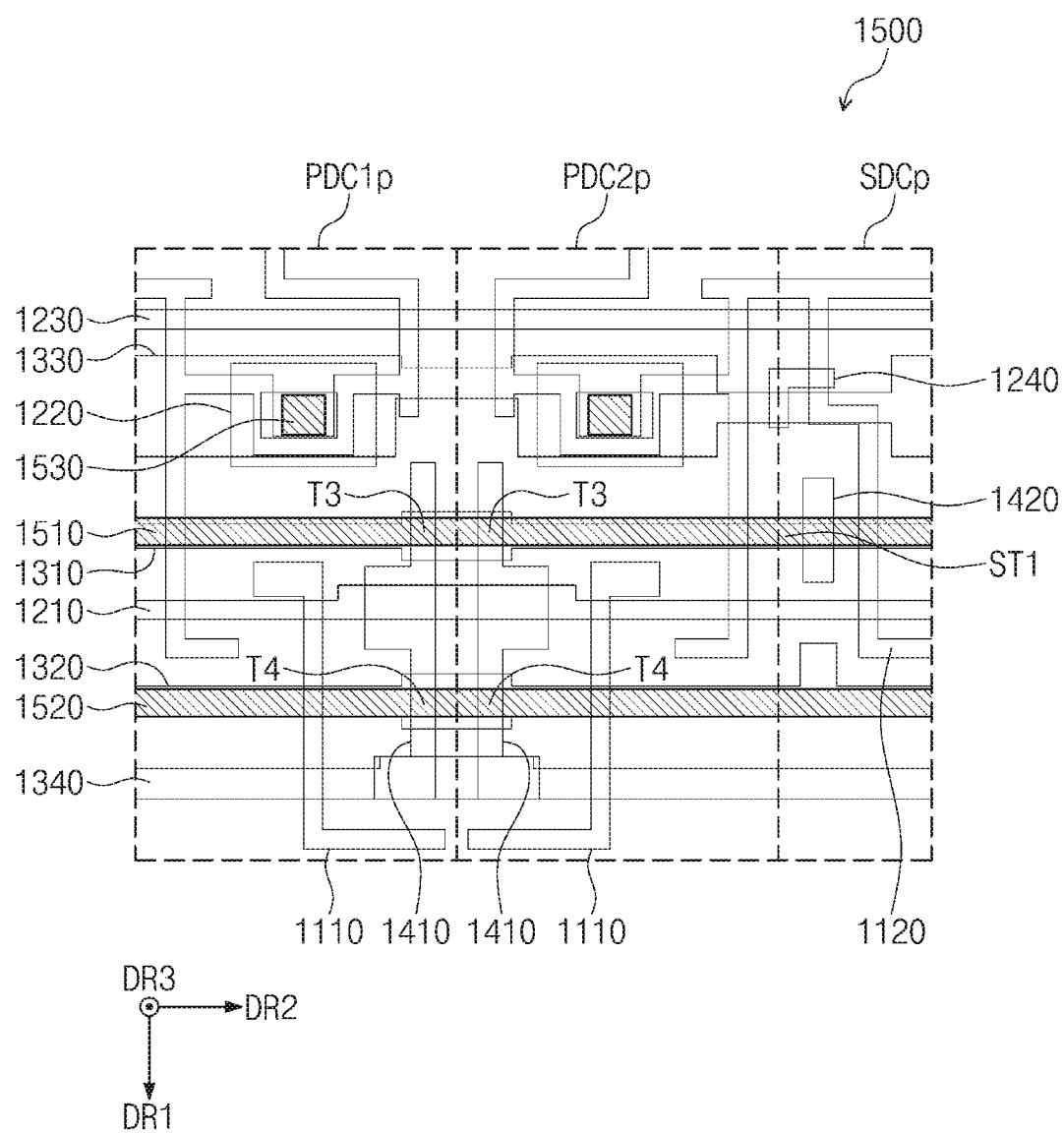

Referring to FIGS. 6 and 8E, a fourth insulating layer 40 may cover the second semiconductor pattern 1400 and may be disposed on the third insulating layer 30. A third conductive pattern 1500 may be disposed on the fourth insulating layer 40. The third conductive pattern 1500 may include or may be formed of metal, an alloy, a conductive metal oxide, a transparent conductive material, or the like.

The third conductive pattern 1500 may include a fifth gate line 1510, a sixth gate line 1520, and a first transmission pattern 1530.

The fifth gate line 1510 may be extended in the second direction DR2. The fifth gate line 1510 may overlap the third gate line 1310 and the third semiconductor portion 1410. In an embodiment, the fifth gate line 1510 may contact the third gate line 1310 through a contact. The jth compensation scan signal SCj may be provided to the fifth gate line 1510. The third gate line 1310, the third semiconductor portion 1410, and the fifth gate line 1510 may form a third transistor T3. For example, the third gate line 1310 may correspond to a back-gate electrode of the third transistor T3, and the fifth gate line 1510 may correspond to a gate electrode of the third transistor T3.

The fifth gate line 1510 may form a reset transistor ST1 together with the fourth semiconductor portion 1420.

The sixth gate line 1520 may overlap the fourth gate line 1320 and the second semiconductor pattern 1400. The sixth gate line 1520 may be electrically connected with the fourth gate line 1320. The jth initialization scan signal SIj may be provided to the sixth gate line 1520. The fourth gate line 1320, the sixth gate line 1520, and the fourth semiconductor portion 1420 may form a fourth transistor T4. For example, the fourth gate line 1320 may correspond to a back-gate electrode of the fourth transistor T4, and the sixth gate line 1520 may correspond to a gate electrode of the fourth transistor T4.

The first transmission pattern 1530 may contact the first gate electrode 1220 exposed through the opening 1330-OP of the storage capacitor electrode 1330. The first transmission pattern 1530 may transfer a first initialization voltage VINT1 (refer to FIG. 4) to the first gate electrode 1220.

Figure 8F:
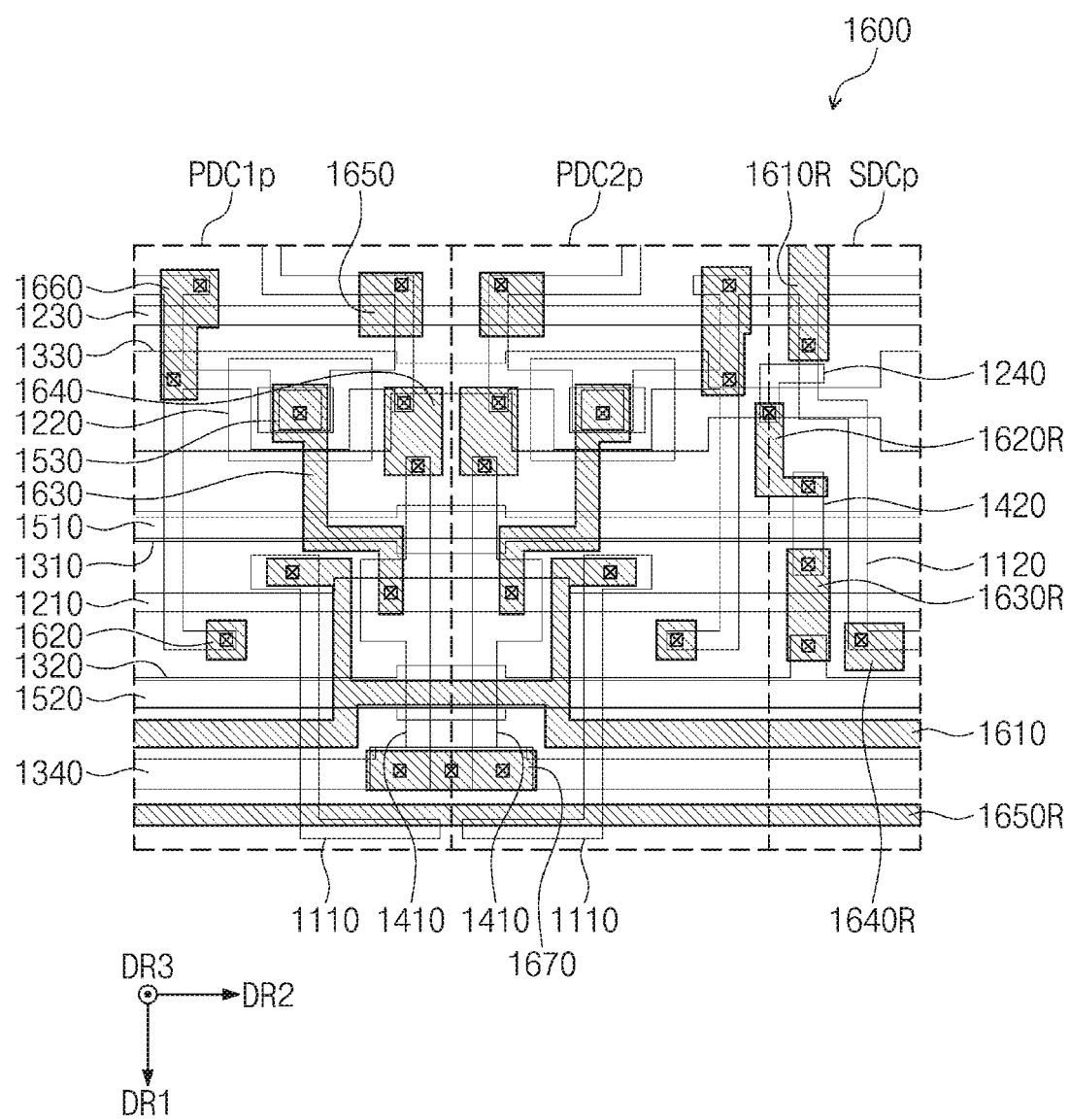

Referring to FIGS. 6 and 8F, a fifth insulating layer 50 may cover at least a portion of the third conductive pattern 1500 and may be disposed on the fourth insulating layer 40. A fourth conductive pattern 1600 may be disposed on the fifth insulating layer 50. The fourth conductive pattern 1600 may include or may be formed of, for example, metal, an alloy, a conductive metal oxide, a transparent conductive material, or the like.

The fourth conductive pattern 1600 may include a second initialization voltage wire 1610, a second transmission pattern 1620, a third transmission pattern 1630, a fourth transmission pattern 1640, a fifth transmission pattern 1650, a sixth transmission pattern 1660, a seventh transmission pattern 1670, an eighth transmission pattern 1610R, a ninth transmission pattern 1620R, a tenth transmission pattern 1630R, an eleventh transmission pattern 1640R, and a signal transmission wire 1650R.

The second initialization voltage wire 1610 may be extended in the second direction DR2. The second initialization voltage wire 1610 may correspond to a second initialization voltage line VL4 (refer to FIG. 5). A second initialization voltage VINT2 may be provided through the second initialization voltage wire 1610.

The second transmission pattern 1620 may contact the first semiconductor portion 1110. A data signal Di (refer to FIG. 5) may be delivered to the first semiconductor portion 1110 through the second transmission pattern 1620.

The third transmission pattern 1630 may contact the third semiconductor portion 1410 and the first transmission pattern 1530 through contact parts respectively formed at one side and the other side. The first initialization voltage VINT1 may be transferred to the first gate electrode 1220 through the second semiconductor pattern 1400, the third transmission pattern 1630, and the first transmission pattern 1530.

The fourth transmission pattern 1640 may contact the third semiconductor portion 1410 and the first semiconductor portion 1110 through contact parts respectively formed at one side and the other side. The fourth transmission pattern 1640 may electrically connect the third semiconductor portion 1410 and the first semiconductor portion 1110.

The fifth transmission pattern 1650 may contact the first semiconductor portion 1110 through a contact part. The fifth transmission pattern 1650 may transfer a driving current or the second initialization voltage VINT2 (refer to FIG. 5) from the first semiconductor portion 1110 to a light emitting element ED (refer to FIG. 5).

The sixth transmission pattern 1660 may contact the first semiconductor portion 1110 and the storage capacitor electrode 1330 through contact parts respectively formed at one side and the other side. A driving voltage ELVDD (refer to FIG. 5) may be transferred to the first semiconductor portion 1110 through the sixth transmission pattern 1660.

The seventh transmission pattern 1670 may contact the third semiconductor portion 1410 and the first initialization voltage wire 1340 through the contact parts. Thus, the first initialization voltage VINT1 may be transferred to the fourth transistor T4.

The eighth transmission pattern 1610R may contact the fourth semiconductor portion 1420. When a sensing driving voltage SLVD (refer to FIG. 5) is the second initialization voltage VINT2, the eighth transmission pattern 1610R may be connected with the first initialization voltage wire 1340. The amplification transistor ST2 may receive the sensing driving voltage SLVD (refer to FIG. 5) through the eighth transmission pattern 1610R.

The ninth transmission pattern 1620R may contact the fourth semiconductor portion 1420 and the second gate electrode 1240 through contact parts respectively formed at one side and the other side. The reset transistor ST1 and the amplification transistor ST2 may be connected by the ninth transmission pattern 1620R.

The tenth transmission pattern 1630R may be connected with the fourth semiconductor portion 1420 and the fourth gate line 1320 through contact parts respectively formed at one side and the other side. The fourth gate line 1320 may correspond to the jth initialization scan line SILj. The reset transistor ST1 may receive the jth initialization scan signal SIj as the reset signal RST through the tenth transmission pattern 1630R.

The eleventh transmission pattern 1640R may contact the first semiconductor pattern 1100 through a contact part. For example, the eleventh transmission pattern 1640R may be connected with the output transistor ST3.

The signal transmission wire 1650R may be extended along the second direction DR2. The signal transmission wire 1650R may correspond to a readout line RL (refer to FIG. 5). For example, the signal transmission wire 1650R may correspond to a part of the readout line RL disposed in a display area DA (refer to FIG. 1). The signal transmission wire 1650R may be extended along the same direction as the gate lines 1210, 1230, 1310, 1320, 1510, and 1520 described above. The signal transmission wire 1650R may fail to intersect the gate lines 1210, 1230, 1310, 1320, 1510, and 1520 in the display area DA. Thus, coupling generated between the signal transmission wire 1650R and the gate lines 1210, 1230, 1310, 1320, 1510, and 1520 may be minimized. As a result, distortion generated in a sensing signal delivered through the signal transmission wire 1650R may be reduced or removed. As a result, fingerprint sensing performance of a display device DD (refer to FIG. 1) may be improved.

Figure 8G:
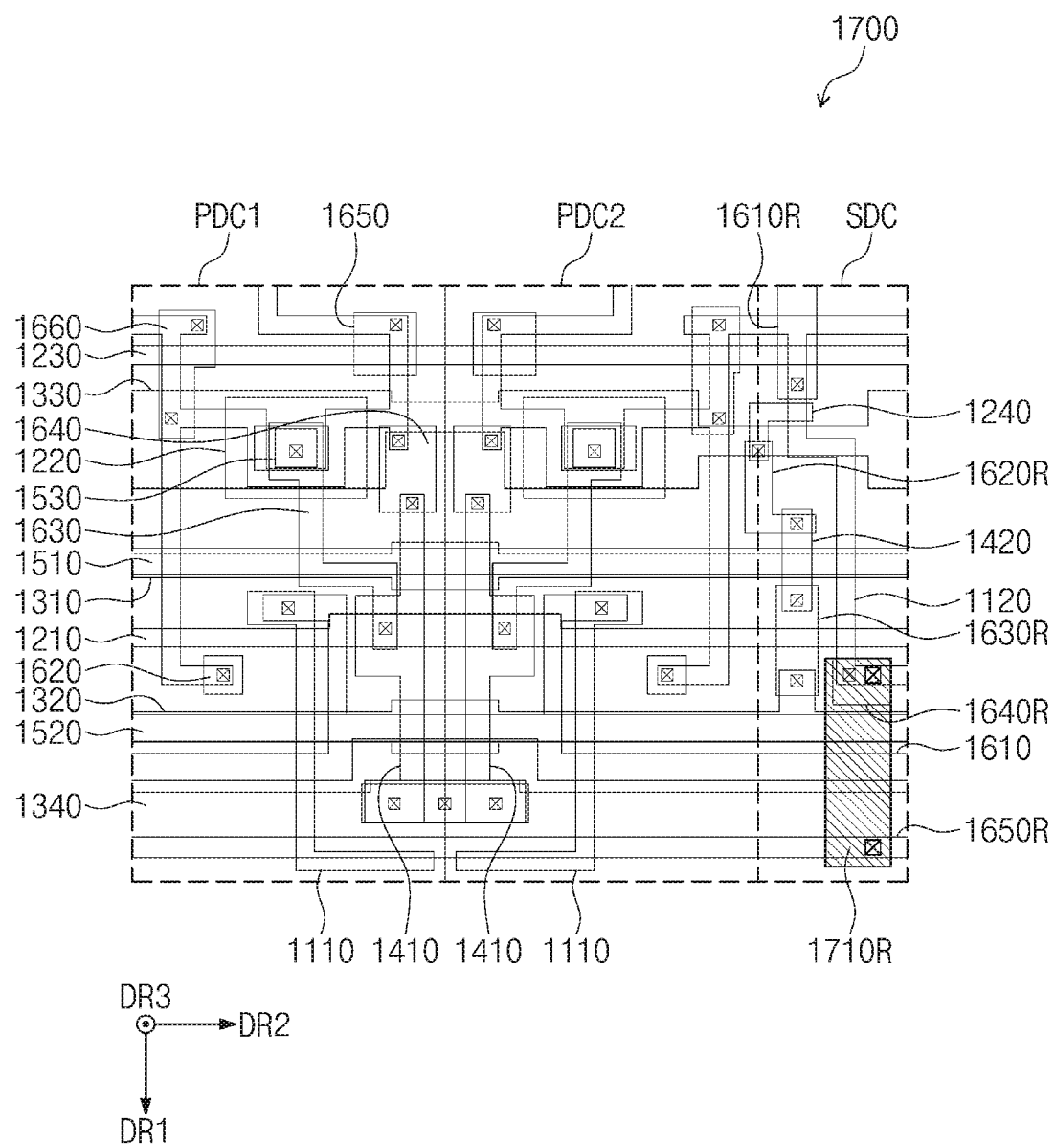

Referring to FIGS. 6 and 8G, a sixth insulating layer 60 may cover at least a portion of the fourth conductive pattern 1600 and may be disposed on the fifth insulating layer 50. A fifth conductive pattern 1700 may be disposed on the sixth insulating layer 60. The fifth conductive pattern 1700 may include or may be formed of, for example, metal, an alloy, a conductive metal oxide, a transparent conductive material, or the like.

The fifth conductive pattern 1700 may include a connection pattern 1710R. Although not illustrated, the fifth conductive pattern 1700 may further include some of signal wires included in the display panel DP. For example, the fifth conductive pattern 1700 may further include data lines.

The connection pattern 1710R may be connected with the eleventh transmission pattern 1640R and the signal transmission wire 1650R through contact parts respectively formed at one side and the other side. The output transistor ST3 may output a sensing signal in response to the output control signal. The sensing signal may be delivered to the signal transmission wire 1650R through the eleventh transmission pattern 1640R and the connection pattern 1710R.

Figure 9:
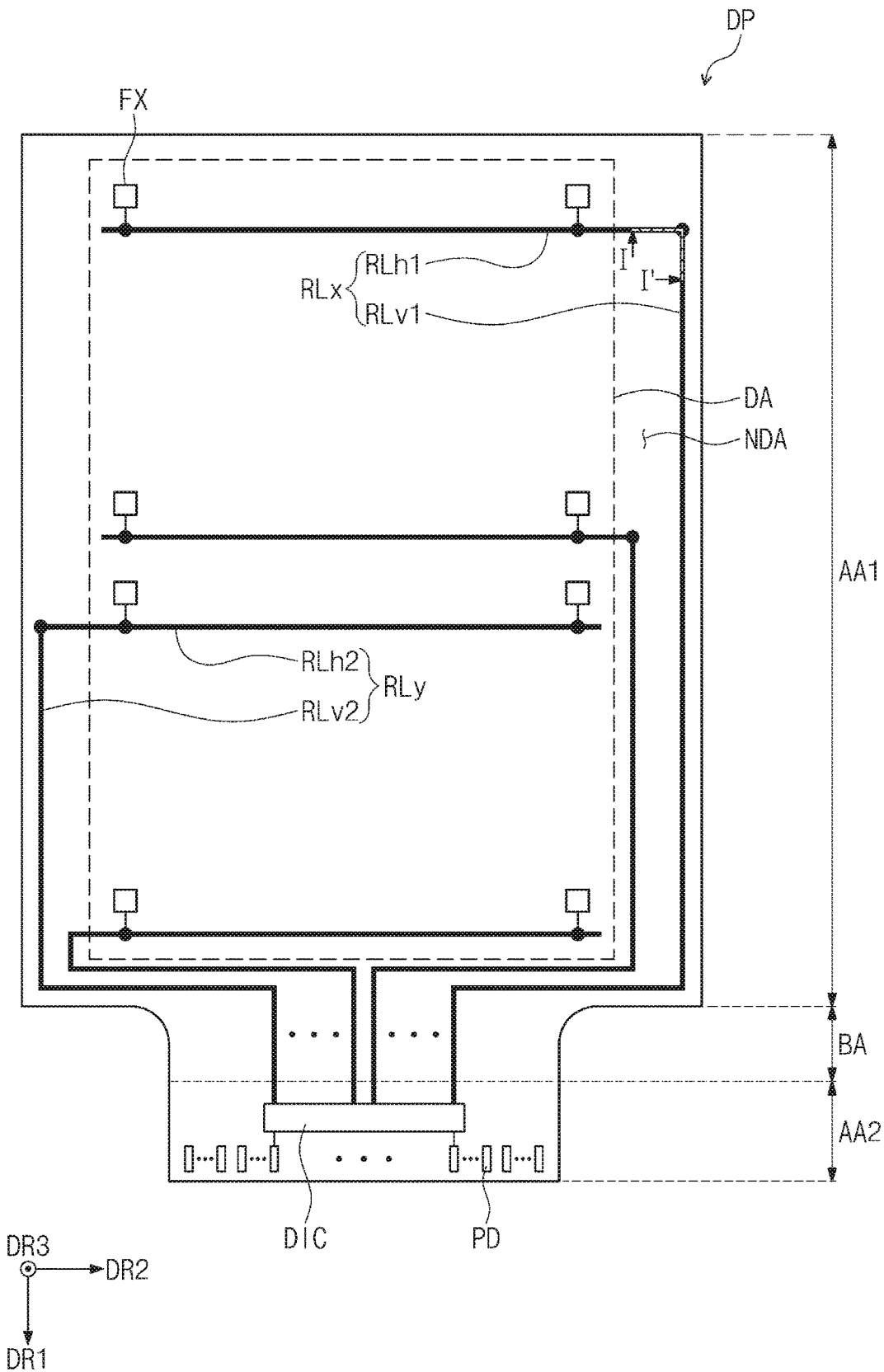
FIG. 9 is a plan view illustrating some components of a display panel according to an embodiment of the present disclosure.

FIG. 9 is a plan view illustrating some components of a display panel according to an embodiment of the present invention.

Referring to FIG. 9, a display panel DP may include a first panel area AA1, a bending area BA, and a second panel area AA2 defined along in a first direction DR1. The second panel area AA2 and the bending area BA may be a partial area of a non-display area NDA. The bending area BA may be disposed between the first panel area AA1 and the second panel area AA2.

A width of the bending area BA parallel to a second direction DR2 and a width (or length) of the second panel area AA2 may be smaller than a width (or length) of the first panel area AA1 parallel to the second direction DR. An area where a length in the direction of a bending axis is shorter may be more easily bent.

When viewed from a plan view, pads PD may be arranged adjacent to a lower end of the second panel area AA2. A driving chip DIC may be electrically connected with the pads PD. A data driver 200 and a readout circuit 500 shown in FIG. 3 may be embedded in the driving chip DIC. A scan driver 300 or a light emitting driver 350 shown in FIG. 3 may be disposed in a non-display area NDA of the display panel DP.

A plurality of sensors FX and readout lines RLx and RLy are illustrated in FIG. 9. The readout lines RLx and RLy may include the first readout lines RLx and the second readout lines RLy. Each of the first readout lines RLx may include a first readout portion RLh1 and a second readout portion RLv1. Each of the second readout lines RLy may include a third readout portion RLh2 and a fourth readout portion RLv2.

Each of the first readout portion RLh1 and the third readout portion RLh2 may be extended along the second direction DR2 from the display area DA to the non-display area NDA. The second readout portion RLv1 and the fourth readout portion RLv2 may be arranged in the non-display area NDA. A portion of each of the second readout portion RLv1 and the fourth readout portion RLv2 may be extended along the first direction DR1.

The second readout portion RLv1 and the fourth readout portion RLv2 may be spaced apart from each other across the display area DA. The non-display area NDA may be smaller in area when the second readout portion RLv1 and the fourth readout portion RLv2 are spaced apart from each other across the display area DA than when the second readout portion RLv1 and the fourth readout portion RLv2 are arranged at one side of the display area DA.

A plurality of sensors FX arranged in one row may be electrically connected with one readout portion RLh1 or RLh2. A readout circuit 500 (refer to FIG. 3) may generate a fingerprint image based on a sensing signal with regard to a time (or timing) of sensing signals received from one readout line RLx or RLy. However, the present disclosure is not limited thereto. In an embodiment of the present disclosure, the plurality of sensors FX arranged in the same column may be connected with the same second readout portion RLv1 or RLv2. The plurality of sensors FX arranged in the same row may be connected with different first readout portions RLh1.

The first readout portion RLh1 and the third readout portion RLh2 may not overlap initialization scan lines SIL1-SILn, compensation scan lines SCL1-SCLn, and write scan lines SWL1-SWLn, which are shown in FIG. 5. For example, in the display area DA, the first readout portion RLh1 and the third readout portion RLh2 may not overlap scan lines such as initialization scan lines SIL1-SILn, compensation scan lines SCL1-SCLn, and write scan lines SWL1-SWLn, which are shown in FIG. 5. Thus, coupling generated in each of the first readout portion RLh1 and the third readout portion RLh2 may be minimized by the initialization scan lines SIL1-SILn, the compensation scan lines SCL1-SCLn, and the write scan lines SWL1-SWLn. Thus, distortion generated in a sensing signal delivered through the first readout portion RLh1 and the third readout portion RLh2 may be reduced or removed. As a result, fingerprint sensing performance of a display device DD (refer to FIG. 1) may be improved.

Figure 10:
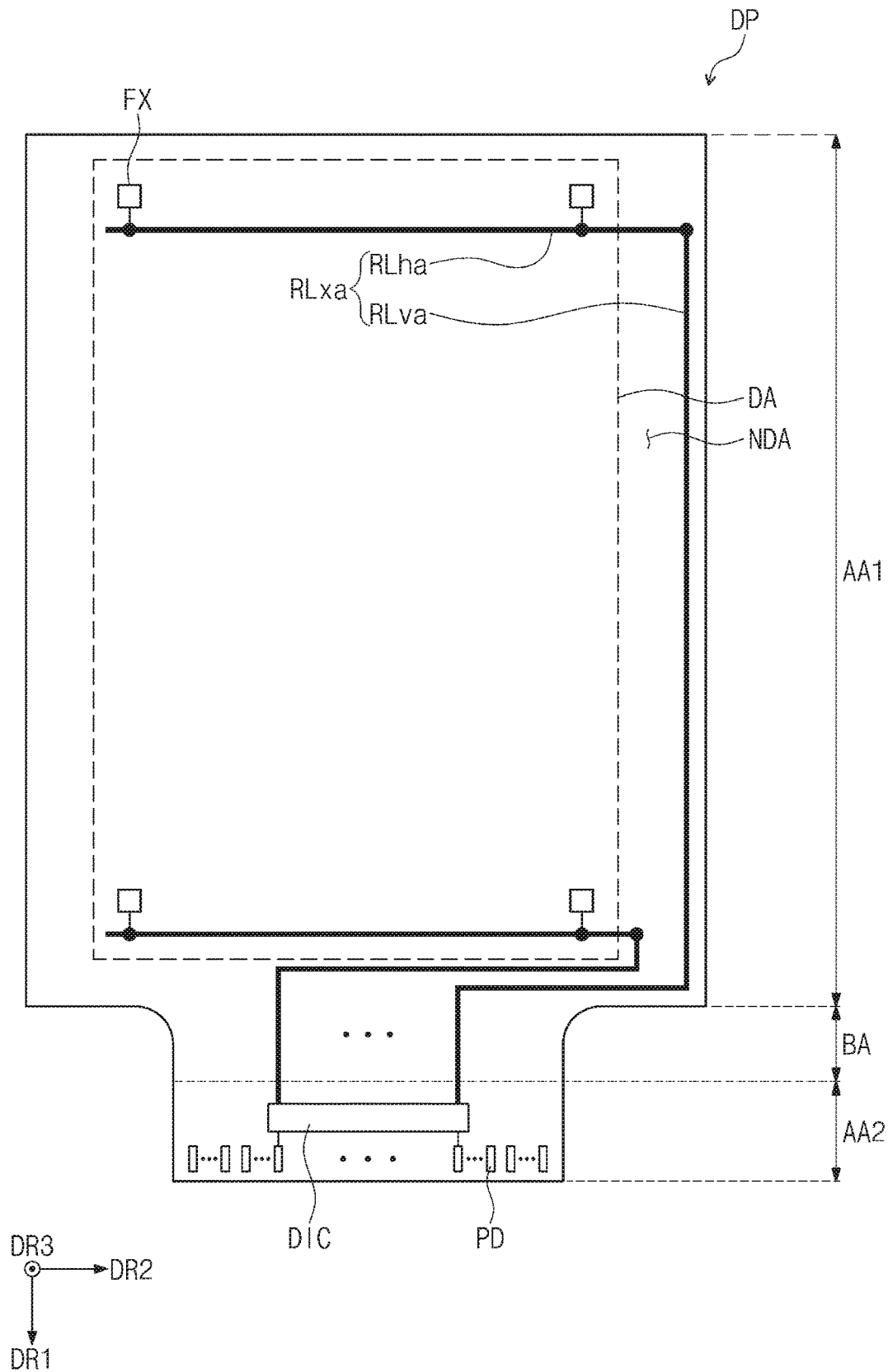
FIG. 10 is a plan view illustrating some components of a display panel according to an embodiment of the present disclosure.

FIG. 10 is a plan view illustrating some components of a display panel according to an embodiment of the present disclosure.

Referring to FIG. 10, a plurality of sensors FX and readout lines RLxa are illustrated. Each of the readout lines RLxa may include a first readout portion RLha and a second readout portion RLva. The first readout portion RLha may be extended along a second direction DR2 from a display area DA to a non-display area NDA. The second readout portion RLva may be disposed in the non-display area NDA. A portion of the second readout portion RLva may be extended along a first direction DR1. In an embodiment, in the display area DA, the first readout portion RLha may not overlap scan lines such as initialization scan lines SIL1-SILn, compensation scan lines SCL1-SCLn, and write scan lines SWL1-SWLn, which are shown in FIG. 5.

Figure 11:
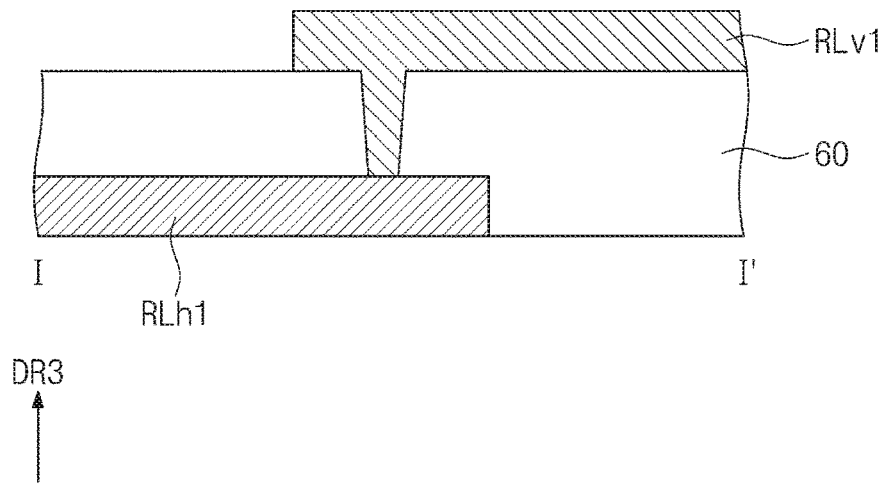
FIG. 11 is a cross-sectional view schematically illustrating a portion taken along I-I' shown in FIG. 9.

FIG. 11 is a cross-sectional view schematically illustrating a portion taken along I-I' shown in FIG. 9.

Referring to FIGS. 6 and 11, a first readout portion RLh1 and a second readout portion RLv1 may be arranged on different layers. For example, the first readout portion RLh1 may be disposed between a fifth insulating layer 50 and a sixth insulating layer 60. The first readout portion RLh1 may correspond to a signal transmission wire 1650R shown in FIG. 8F. The second readout portion RLv1 may be disposed on the sixth insulating layer 60. The second readout portion RLv1 may be disposed on the same layer as a fifth conductive pattern 1700 (refer to FIG. 8G) and may include or may be formed of the same material as the fifth conductive pattern 1700. The second readout portion RLv1 may penetrate the sixth insulating layer 60 and may contact the first readout portion RLh1.

Figure 12:
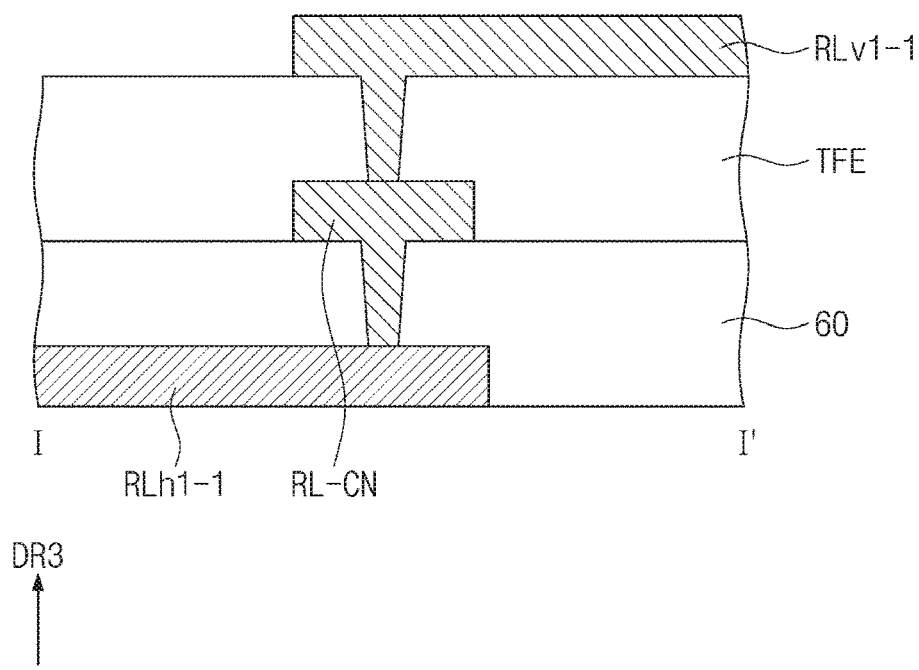
FIG. 12 is a drawing schematically illustrating a cross section including a portion taken along I-I' shown in FIG. 9.

FIG. 12 is a drawing schematically illustrating a cross section including a portion taken along I-I' shown in FIG. 9.

Referring to FIGS. 6, 7A, and 12, a first readout portion Rlh1-1 and a second readout portion RLv1-1 may be arranged on different layers. For example, the first readout portion RLh1-1 may be disposed between a fifth insulating layer 50 and a sixth insulating layer 60. The first readout portion RLh1-1 may correspond to a signal transmission wire 1650R shown in FIG. 8F.

The second readout portion RLv1-1 may be included in an input sensing layer ISL. For example, the second readout portion RLv1-1 may be included in a first conductive layer ICL1 or a second conductive layer ICL2 of the input sensing layer ISL.

A connection electrode RL-CN for connecting the first readout portion RLh1-1 and the second readout portion RLv1-1 may be disposed on the sixth insulating layer 60. The connection electrode RL-CN may be disposed on the same layer as a fifth conductive pattern 1700 (refer to FIG. 8G) and may include or may be formed of the same material as the fifth conductive pattern 1700. The connection electrode RL-CN may penetrate the sixth insulating layer 60 to contact the first readout portion RLh1-1. The second readout portion RLv1-1 may penetrate an encapsulation layer TFE to contact the connection electrode RL-CN.

The structure where the sixth insulating layer 60 and the encapsulation layer TFE are in contact with each other in a non-display area NDA is illustrated as an example in FIG. 12, but not limited thereto. For example, another insulating layer, for example, a seventh insulating layer 70 may be further disposed between the sixth insulating layer 60 and the encapsulation layer TFE.

All of second readout portions of readout lines RL1-RLn (refer to FIG. 3) may be arranged on the same layer as a fifth conductive pattern 1700 (refer to FIG. 8G), may be included in the first conductive layer ICL1, or may be included in the second conductive layer ICL2. In an embodiment, some of the second readout portions of the readout lines RL1-RLn (refer to FIG. 3) may be arranged on the same layer as the fifth conductive pattern 1700 (refer to FIG. 8G), some thereof may be included in the first conductive layer ICL1, or the others may be included in the second conductive layer ICL2. In an embodiment, each of the second readout portions of the readout lines RL1-RLn (refer to FIG. 3) may be included in the same layer as the fifth conductive pattern 1700 (refer to FIG. 8G), in the first conductive layer ICL1, or in the second conductive layer ICL2.

According to the above, the readout line connected with the sensor which outputs the sensing signal may be extended along the same direction as scan lines. In an embodiment, the readout line and the scan lines may extend in parallel in the same direction in the display area. The readout line may not overlap the scan lines in the display area. Coupling between the readout line and the scan lines may be minimized. In other words, distortion generated in the sensing signal delivered through the readout line may be reduced or removed. As a result, fingerprint sensing performance of the display device may be improved.

While the present disclosure has been described with reference to an embodiment thereof, it will be apparent to those of ordinary skill in the art that various changes and modifications may be made thereto without departing from the spirit and scope of the present disclosure as set forth in the following claims. Accordingly, the technical scope of the present disclosure should not be limited to the contents described in the detailed description of the specification, but should be defined by the claims.

What is claimed is:

1. A display device, comprising:
 a display panel in which a display area and a non-display area are defined,
 wherein the display panel includes:
 a plurality of pixels including a first pixel disposed in the display area and including a light emitting element and a pixel driving circuit electrically connected with the light emitting element;
 a plurality of sensors including a first sensor disposed in the display area and including a photo sensing element and a sensor driving circuit electrically connected with the photo sensing element;
 a data line electrically connected with the first pixel and extended along a first direction;
 a plurality of scan lines including a first scan line electrically connected with the first pixel and the first sensor and extended along a second direction intersecting the first direction;
 a readout line including a first readout portion in the display area, wherein the first readout portion is electrically connected with the first sensor and is extended along the second direction in the display area and beyond a boundary between the display area and the non-display area; and
 a connection pattern connected to the sensor driving circuit through a first contact part and connected to the first readout portion through a second contact part, wherein the first contact part and the second contact part are spaced apart in the first direction.

2. The display device of claim 1,
 wherein the first readout portion of the readout line does not overlap the plurality of scan lines in the display area, and
 wherein the first readout portion of the readout line and the plurality of scan lines are parallel in the display area.

3. The display device of claim 1,
 wherein the first readout portion of the readout line is extended along the second direction from the display area to the non-display area,
 wherein the readout line further includes:
 a second readout portion disposed in the non-display area and connected to the first readout portion at the non-display area, and
 wherein the second readout portion is extended along the first direction from the non-display area to the first readout portion.

4. The display device of claim 3,
 wherein the first readout portion and the second readout portion are arranged on different layers from each other.

5. The display device of claim 3,
 wherein the sensor driving circuit includes:
 a reset transistor including a first electrode configured to receive a reset signal, a second electrode connected with a first sensing node, and a third electrode configured to receive a reset control signal;
an amplification transistor including a first electrode configured to receive a sensing driving voltage, a second electrode connected with a second sensing node, and a third electrode connected with the first sensing node; and
an output transistor including a first electrode connected with the second sensing node, a second electrode connected with the readout line, and a third electrode configured to receive an output control signal.

6. The display device of claim 5,
wherein the connection pattern electrically connects the output transistor and the readout line with each other.

7. The display device of claim 6,
wherein the connection pattern is extended along the first direction, and
wherein the connection pattern is disposed on a layer different from the first readout portion.

8. The display device of claim 6,
wherein the connection pattern and the second readout portion are disposed on the same layer.

9. The display device of claim 1, further comprising:
an input sensing layer disposed on the display panel and including a first conductive layer and a second conductive layer,
wherein a portion of the readout line is included in the first conductive layer or the second conductive layer.

10. The display device of claim 9,
wherein the first readout portion of the readout line is extended along the second direction from the display area to the non-display area,
wherein the readout line further includes:
a second readout portion disposed in the non-display area and connected to the first readout portion at the non-display area,
wherein the second readout portion is extended along the first direction from the non-display area to the first readout portion, and
wherein the second readout portion is included in the first conductive layer or the second conductive layer.

11. The display device of claim 10,
wherein the display panel further includes:
a connection electrode connected with each of the first readout portion and the second readout portion.

12. The display device of claim 1,
wherein the plurality of scan lines include an initialization scan line, a compensation scan line, and a write scan line, connected with the first pixel, and
wherein the first readout portion of the readout line does not overlap each of the initialization scan line, the compensation scan line, and the write scan line.

13. The display device of claim 1,
wherein the pixel driving circuit includes:
a first transistor selectively connecting a first driving voltage line configured to receive a first driving voltage and the light emitting element;
a second transistor selectively connecting the data line and a first electrode of the first transistor;
a third transistor selectively connecting a second electrode of the first transistor and a first node, wherein the third transistor is configured to receive a first scan signal;
a fourth transistor selectively connecting a first initialization voltage line through which a first initialization voltage is applied and the first node, wherein the fourth transistor is configured to receive a second scan signal; and
a seventh transistor selectively connecting a second initialization voltage line through which a second initialization voltage is applied and an anode of the light emitting element, wherein the seventh transistor is configured to receive a third scan signal.

14. The display device of claim 13,
wherein the second initialization voltage line and the first readout portion of the readout line disposed in the display area are disposed on the same layer.

15. A display device, comprising:
a display panel in which a display area and a non-display area are defined,
wherein the display panel includes:
a pixel disposed in the display area and including a light emitting element and a pixel driving circuit electrically connected with the light emitting element;
a sensor disposed in the display area and including a photo sensing element and a sensor driving circuit electrically connected with the photo sensing element;
a readout line electrically connected with the sensor and including a first readout portion in the display area and a second readout portion in the non-display area, wherein the first readout portion and the second readout portion are extended along different directions from each other, and wherein the first readout portion in the display area and the second readout portion in the non-display area are arranged on different layers from each other;
a scan line electrically connected with the pixel and the sensor and extended along the same direction as an extending direction of the first readout portion; and
a connection pattern connected to the sensor driving circuit through a first contact part and connected to the first readout portion through a second contact part, wherein the first contact part and the second contact part are spaced apart in a direction intersecting the extending direction of the first readout portion.

16. The display device of claim 15,
wherein the display panel further includes:
a data line electrically connected with the pixel and extended along the same direction as an extending direction of the second readout portion, and
wherein the first readout portion does not overlap the scan line.

17. The display device of claim 16,
wherein the pixel driving circuit includes:
a first transistor selectively connecting a first driving voltage line configured to receive a first driving voltage and the light emitting element;
a second transistor selectively connecting the data line and a first electrode of the first transistor;
a third transistor selectively connecting a second electrode of the first transistor and a first node, wherein the third transistor is configured to receive a first scan signal;
a fourth transistor selectively connecting a first initialization voltage line through which a first initialization voltage is applied and the first node, wherein the fourth transistor is configured to receive a second scan signal; and
a seventh transistor selectively connecting a second initialization voltage line through which a second initialization voltage is applied and an anode of the light emitting element, wherein the seventh transistor is configured to receive a third scan signal, and wherein the first readout portion and the second initialization voltage line are disposed on the same layer as each other.

18. The display device of claim 15, further comprising:
an input sensing layer disposed on the display panel and including a first conductive layer and a second conductive layer,
wherein the second readout portion is included in the first conductive layer or the second conductive layer.

19. The display device of claim 15,
wherein the sensor driving circuit includes:
a reset transistor including a first electrode configured to receive a reset signal, a second electrode connected with a first sensing node, and a third electrode configured to receive a reset control signal;
an amplification transistor including a first electrode configured to receive a sensing driving voltage, a second electrode connected with a second sensing node, and a third electrode connected with the first sensing node; and
an output transistor including a first electrode connected with the second sensing node, a second electrode connected with the readout line, and a third electrode configured to receive an output control signal.

20. The display device of claim 19,
wherein the connection pattern is extended along a direction different from the extending direction of the first readout portion, and
wherein the connection pattern and the first readout portion are disposed on different layers from each other.

* * * * *